United States Patent
Suzuki

(10) Patent No.: US 7,482,269 B2
(45) Date of Patent: Jan. 27, 2009

(54) METHOD FOR CONTROLLING THE STEP COVERAGE OF A RUTHENIUM LAYER ON A PATTERNED SUBSTRATE

(75) Inventor: Kenji Suzuki, Guilderland, NY (US)

(73) Assignee: Tokyo Electron Limited, Tokyo (JP)

( * ) Notice: Subject to any disclaimer, the term of this patent is extended or adjusted under 35 U.S.C. 154(b) by 443 days.

(21) Appl. No.: 11/238,487

(22) Filed: Sep. 28, 2005

(65) Prior Publication Data

US 2007/0072414 A1 Mar. 29, 2007

(51) Int. Cl.
*H01L 21/4763* (2006.01)
(52) U.S. Cl. .................. 438/650; 257/E21.593
(58) Field of Classification Search ............... 438/650; 257/E21.593
See application file for complete search history.

(56) References Cited

U.S. PATENT DOCUMENTS

| | | | | |
|---|---|---|---|---|
| 6,303,809 | B1 | 10/2001 | Chi et al. ............... | 556/136 |
| 6,319,832 | B1 | 11/2001 | Uhlenbrock et al. ...... | 438/681 |
| 6,440,495 | B1 | 8/2002 | Wade et al. ............. | 427/250 |
| 6,605,735 | B2 | 8/2003 | Kawano et al. ........... | 556/136 |
| 6,713,373 | B1 | 3/2004 | Omstead ................ | 438/608 |
| 6,924,223 | B2 * | 8/2005 | Yamasaki et al. .......... | 438/622 |
| 2005/0069632 | A1 | 3/2005 | Yamasaki et al. | |
| 2005/0081882 | A1 | 4/2005 | Greer et al. ............. | 134/1.1 |
| 2005/0110142 | A1 | 5/2005 | Lane et al. ............. | 257/751 |
| 2005/0186341 | A1 | 8/2005 | Hendrix et al. .......... | 427/248.1 |

OTHER PUBLICATIONS

European Patent Office, International Search Report and Written Opinion of corresponding PCT application PCT/US2006/026225, dated Mar. 13, 2007, 9 pgs.
Wade et al., *Chemical Vapor Deposition of Ruthenium Films for Metal Electrode Applications*, US 2003/0129306 A1, Publication Date Jul. 10, 2003, Filed Jul, 10, 2002.
Chang et al., *Ruthenium Layer Formation for Copper Film Deposition*, US 2004/0105934 A1, Publication Date Jun. 3, 2004, Filed Aug. 4, 2003.

* cited by examiner

*Primary Examiner*—Thao X Le
*Assistant Examiner*—Elias Ullah
(74) *Attorney, Agent, or Firm*—Wood, Herron & Evans, LLP

(57) ABSTRACT

A method for forming a Ru layer for an integrated circuit by providing a patterned substrate in a process chamber, and exposing the substrate to a process gas comprising a ruthenium carbonyl precursor and a CO gas to form a Ru layer over a feature of the patterned substrate. In one embodiment, the CO partial pressure in the process chamber is varied during the exposing to control the step coverage of the Ru layer over the feature. In an alternative or further embodiment, the step coverage can be controlled by varying the substrate temperature during the exposure.

29 Claims, 13 Drawing Sheets

METHOD FOR CONTROLLING THE STEP COVERAGE OF A RUTHENIUM LAYER ON A PATTERNED SUBSTRATE

CROSS REFERENCE TO RELATED APPLICATIONS

The present invention is related to U.S. patent application Ser. No. 10/996,145 entitled METHOD FOR INCREASING DEPOSITION RATES OF METAL LAYERS FROM METAL-CARBONYL PRECURSORS, now U.S. Pat. No. 7,270,848 issued Sep. 18, 2007, and U.S. patent application Ser. No. 10/996,144 entitled METHOD AND DEPOSITION SYSTEM FOR INCREASING DEPOSITION RATES OF METAL LAYERS FROM METAL-CARBONYL PRECURSORS, now U.S. Pat. No. 7,279,421 issued Oct. 9, 2007 the entire contents of which are herein incorporated by reference.

FIELD OF THE INVENTION

The present invention relates to semiconductor processing, and more particularly, to a method for controlling the step coverage of a Ru layer deposited on a patterned substrate.

BACKGROUND OF THE INVENTION

The introduction of copper (Cu) metal into multilayer metallization schemes for manufacturing integrated circuits can necessitate the use of diffusion barriers/liners to promote adhesion and growth of the Cu layers and to prevent diffusion of Cu into the dielectric materials. Barriers/liners that are deposited onto dielectric materials can include refractive materials, such as tungsten (W), molybdenum (Mo), and tantalum (Ta), that are non-reactive and immiscible in Cu, and can offer low electrical resistivity. For example, Cu integration schemes for technology nodes less than or equal to 130 nm can utilize a low dielectric constant (low-k) inter-level dielectric, followed by a physical vapor deposition (PVD) Ta layer or a TaN/Ta layer, followed by a PVD Cu seed layer, and an electro-chemical deposition (ECD) Cu fill. Generally, Ta layers are chosen for their adhesion properties (i.e., their ability to adhere on low-k films), and TaN/Ta layers are generally chosen for their barrier properties (i.e., their ability to prevent Cu diffusion into the low-k film).

More recently, other materials, such as ruthenium (Ru) and rhodium (Rh) have been identified as potential barrier and seed layers since they are expected to behave similarly to conventional refractory metals. In one example, Ru or Rh layers can be deposited onto Ta/TaN layers. However, it is possible that the use of Ru or Rh can permit the use of only one barrier layer, as opposed to two layers, such as Ta/TaN. For example, it is possible that a Ru layer can replace the Ta/TaN barrier layer. Moreover, current research is finding that a Ru layer can further replace the Cu seed layer, and bulk Cu fill can proceed directly following Ru deposition.

Ru layers can be deposited from a ruthenium-containing precursor, such as a ruthenium carbonyl precursor or a ruthenium organometallic precursor. However, Ru deposition processes can suffer from low deposition rates due to the low vapor pressures of a number of ruthenium precursors and the transport issues associated therewith, thereby making deposition of Ru layers impractical even if the deposition provides good step coverage over high-aspect-ratio features. On the other hand, Ru deposition processes with high enough deposition rates for manufacturing can suffer from unacceptable step coverage over high-aspect-ratio features. Overall, the inventors have observed that new Ru deposition processes are needed that can provide high deposition rates and desired step coverage over high-aspect-ratio features.

SUMMARY OF THE INVENTION

Embodiments of the invention provide a method of forming a Ru layer for an integrated circuit. According to an embodiment of the invention, a Ru layer is formed on a patterned substrate from a process gas containing a ruthenium carbonyl precursor and CO gas in a chemical vapor deposition process, where the step coverage of the Ru layer over a feature of the patterned substrate can be controlled by varying the CO partial pressure and/or the substrate temperature. The feature can be any type of structure used in manufacturing of integrated circuits, including a via or a trench, or a combination thereof. The Ru layer can be utilized in barrier layer and seed layer applications, including a Ru seed layer and a Ru diffusion barrier for Cu metallization technology.

According to an embodiment of the invention, the method includes providing a patterned substrate in a process chamber and exposing the substrate to a process gas containing a ruthenium carbonyl precursor and a CO gas to form a Ru layer over a feature of the patterned substrate, where the CO partial pressure in the process chamber is varied during the exposing to control the step coverage of the Ru layer.

According to an embodiment of the invention, the method includes providing a patterned substrate in a process chamber and exposing the substrate to a process gas containing a ruthenium carbonyl precursor and a CO gas to form a Ru layer over a feature of the patterned substrate by depositing a first Ru sublayer over the feature while maintaining a first CO partial pressure in the process chamber, where the first Ru sublayer has a first step coverage, and depositing a second Ru sublayer over the first Ru layer while maintaining a second CO partial pressure in the process chamber, where the second Ru sublayer has a second step coverage, where the first CO partial pressure is greater than the second CO partial pressure and the first step coverage is greater than the second step coverage.

According to another embodiment of the invention, the method includes providing a patterned substrate in a process chamber and exposing the substrate to a process gas containing a ruthenium carbonyl precursor and a CO gas to form a Ru layer over a feature of the patterned substrate by depositing a first Ru sublayer over the feature while maintaining a first substrate temperature in the process chamber, where the first Ru sublayer has a first step coverage, and depositing a second Ru sublayer over the first Ru layer while maintaining a second substrate temperature in the process chamber, where the second Ru sublayer has a second step coverage, where the first substrate temperature is lower than the second substrate temperature and the first step coverage is greater than the second step coverage.

DETAILED DESCRIPTION OF SEVERAL EMBODIMENTS OF THE INVENTION

One challenge encountered in electrochemical plating processing and the plating equipment is non-uniform thickness of plated Cu metal onto a seed layer due to the terminal ('resistive substrate') effect. The terminal effect is the tendency for the current density to be non-uniform as a result of the ohmic potential drop associated with conducting current from the wafer edge to the entire wafer surface through a thin resistive seed layer. This problem can be more severe for a highly resistive non-Cu (e.g., Ru) seed layer than a lower resistivity Cu seed layer. The sheet resistance of a non-Cu seed layer can be orders of magnitude higher than that of today's Cu seed layers and straightforward extension of methods currently used to manipulate current distribution (e.g., electrolyte conductivity) generally will not be adequate to combat the terminal effect experienced using a non-Cu seed layer.

In one embodiment of the invention, the step coverage of a Ru layer over a feature is controlled to reduce the terminal effect. In one example, a Ru layer with a variable thickness is deposited onto a substrate containing a feature, where the thickness of the Ru layer away from a feature is greater than the thickness of the Ru layer inside the feature. In this example, the terminal effect is reduced due to the relatively thick Ru layer away from the feature while the lower Ru layer thickness inside the feature provides the required diffusion layer or seed layer properties.

The method includes providing a patterned substrate in a process chamber, and exposing the substrate to a process gas comprising a ruthenium carbonyl precursor and a CO gas to form a Ru layer over a feature of the patterned substrate. The CO partial pressure in the process chamber can be varied during the exposing to control the step coverage of the Ru layer over the feature. In addition, or in the alternative, the step coverage can be controlled by varying the substrate temperature during the exposure.

In the following description, in order to facilitate a thorough understanding of the invention and for purposes of explanation and not limitation, specific details are set forth, such as a particular geometry of the deposition systems and the processing tool and descriptions of various components. However, it should be understood that the invention may be practiced in other embodiments that depart from these specific details.

Figure 1A:
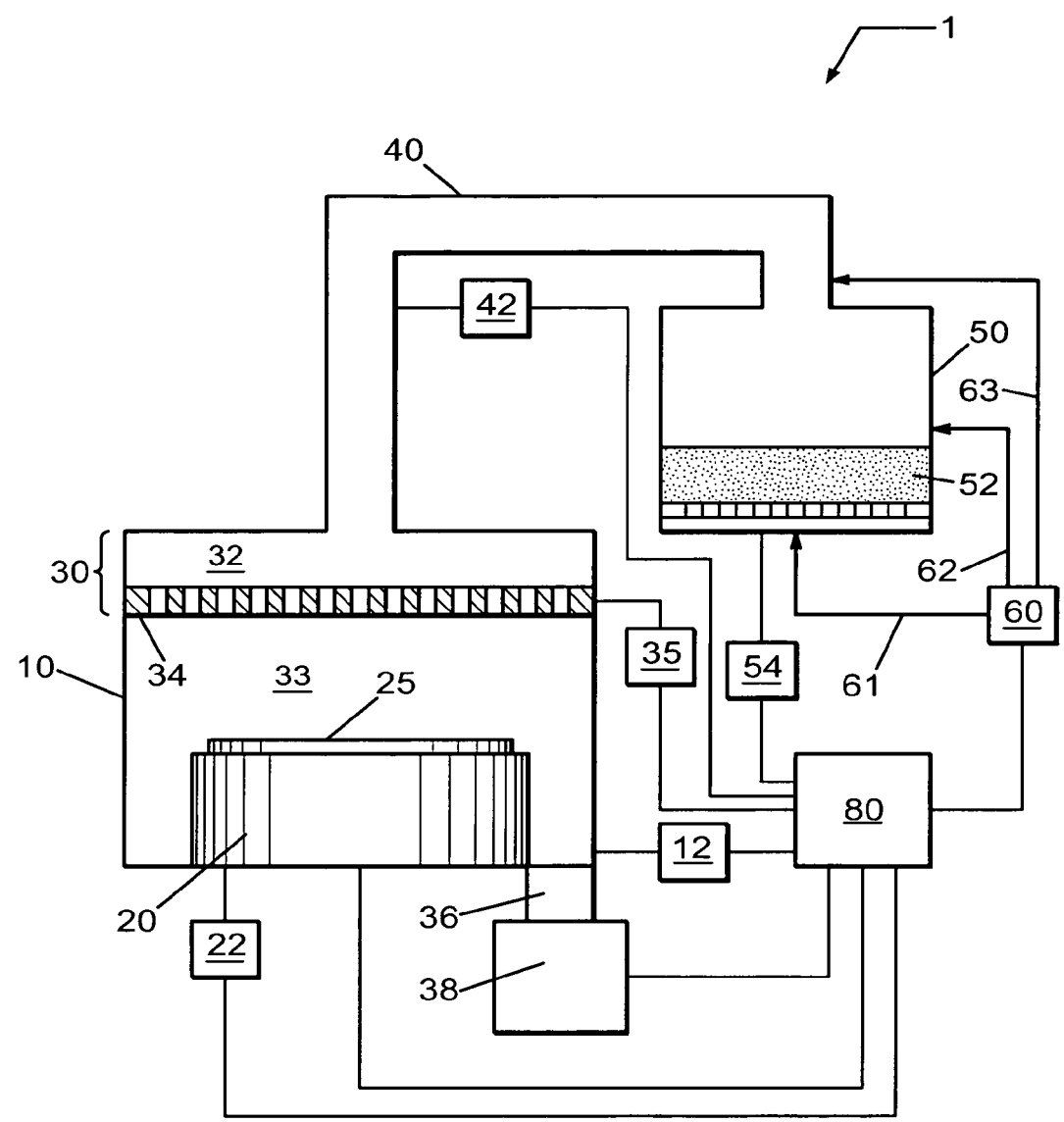
FIG. 1A depicts a schematic view of a deposition system according to an embodiment of the invention.

Referring now to the drawings, wherein like reference numerals may designate identical or corresponding parts throughout one or more views, FIG. 1A illustrates a deposition system 1 for depositing a Ru layer on a substrate from a ruthenium carbonyl precursor according to an embodiment of the invention. The following sections describe the use of a ruthenium carbonyl precursor, $Ru_3(CO)_{12}$, however as described above, other ruthenium carbonyl precursors may be used without departing from the scope of the invention. The deposition system 1 comprises a process chamber 10 having a substrate holder 20 configured to support a substrate 25 upon which the Ru layer is formed. The process chamber 10 is coupled to a metal precursor vaporization system 50 via a vapor precursor delivery system 40.

The process chamber 10 is further coupled to a vacuum pumping system 38 through a duct 36, wherein the pumping system 38 is configured to evacuate the process chamber 10, vapor precursor delivery system 40, and metal precursor vaporization system 50 to a pressure suitable for forming the Ru layer on the substrate 25, and suitable for vaporization of the ruthenium carbonyl precursor 52 in the metal precursor vaporization system 50.

Still referring to FIG. 1A, the metal precursor vaporization system 50 is configured to store a ruthenium carbonyl precursor 52, to heat the ruthenium carbonyl precursor 52 to a temperature sufficient for vaporizing the ruthenium carbonyl precursor 52, and to introduce ruthenium carbonyl precursor vapor to the vapor precursor delivery system 40. The ruthenium carbonyl precursor 52 ($Ru_3(CO)_{12}$) is a solid under the selected heating conditions in the metal precursor vaporization system 50, however, those skilled in the art will appreciate that other ruthenium carbonyl precursors that are liquids under the selected heating conditions can be used without departing from the scope of the invention.

In order to achieve the desired temperature for subliming the solid ruthenium carbonyl precursor 52, the metal precursor vaporization system 50 is coupled to a vaporization temperature control system 54 configured to control the vaporization temperature. For instance, the temperature of the ruthenium carbonyl precursor 52 is generally elevated to approximately 40° C. to approximately 45° C. in conventional systems in order to sublime the $Ru_3(CO)_{12}$. At this temperature, the vapor pressure of the $Ru_3(CO)_{12}$, for instance, ranges from approximately 1 to approximately 3 mTorr. As the ruthenium carbonyl precursor 52 is heated to cause sublimation, a CO-containing gas can be passed over or through the ruthenium carbonyl precursor 52, or any combination thereof. The CO-containing gas contains CO and optionally an inert carrier gas, such as $N_2$, or a noble gas (i.e., He, Ne, Ar, Kr, or Xe), or a combination thereof.

For example, a gas supply system 60 is coupled to the metal precursor vaporization system 50, and it is configured to, for instance, supply CO, a carrier gas, or a mixture thereof, beneath the ruthenium carbonyl precursor 52 via feed line 61, or over the ruthenium carbonyl precursor 52 via feed line 62. In addition, or in the alternative, the gas supply system 60 is coupled to the vapor precursor delivery system 40 downstream from the metal precursor vaporization system 50 to supply the gas to the vapor of the ruthenium carbonyl precursor 52 via feed line 63 as or after it enters the vapor precursor delivery system 40. Although not shown, the gas supply system 60 can comprise a carrier gas source, a CO gas source, one or more control valves, one or more filters, and a mass flow controller. For instance, the flow rate of the CO-containing gas can be between about 0.1 standard cubic centimeters per minute (sccm) and about 1000 sccm. Alternately, the flow rate of the CO-containing gas can be between about 10 sccm and about 500 sccm. Still alternately, the flow rate of the CO-containing gas can be between about 50 sccm and about 200 sccm. According to embodiments of the invention, the flow rate of the CO gas can range from approximately 0.1 sccm to approximately 1000 sccm. Alternately, the flow rate of the CO gas can be between about 1 sccm and about 500 sccm.

Downstream from the metal precursor vaporization system 50, the process gas containing the ruthenium carbonyl precursor vapor flows through the vapor precursor delivery system 40 until it enters the process chamber 10 via a vapor distribution system 30 coupled thereto. The vapor precursor delivery system 40 can be coupled to a vapor line temperature control system 42 in order to control the vapor line temperature and prevent decomposition of the ruthenium carbonyl precursor vapor as well as condensation of the ruthenium carbonyl precursor vapor.

Referring again to FIG. 1A, the vapor distribution system 30, which forms part of and is coupled to the process chamber 10, comprises a vapor distribution plenum 32 within which the vapor disperses prior to passing through a vapor distribution plate 34 and entering a processing zone 33 above substrate 25. In addition, the vapor distribution plate 34 can be coupled to a distribution plate temperature control system 35 configured to control the temperature of the vapor distribution plate 34.

Once the process gas containing the ruthenium carbonyl precursor vapor enters the processing zone 33 of process chamber 10, the ruthenium carbonyl precursor vapor thermally decomposes upon adsorption at the substrate surface due to the elevated temperature of the substrate 25, and a Ru layer is formed on the substrate 25. The substrate holder 20 is configured to elevate the temperature of the substrate 25 by virtue of the substrate holder 20 being coupled to a substrate temperature control system 22. For example, the substrate temperature control system 22 can be configured to elevate the temperature of the substrate 25 up to approximately 500° C. Additionally, the process chamber 10 can be coupled to a chamber temperature control system 12 configured to control the temperature of the chamber walls.

Conventional systems have contemplated operating the metal precursor vaporization system 50, as well as the vapor precursor delivery system 40, within a temperature range of approximately 40° C. to approximately 45° C. for $Ru_3(CO)_{12}$ in order to prevent decomposition, which occurs at higher temperatures. For example, $Ru_3(CO)_{12}$ can decompose at elevated temperatures to form by-products, such as those illustrated below:

$$Ru_3(CO)_{12}(ad) \Leftrightarrow Ru_3(CO)_x(ad) + (12-x)CO(g) \quad (1)$$

or, $$Ru_3(CO)_x(ad) \Leftrightarrow 3Ru(s) + xCO(g) \quad (2)$$

wherein these by-products can adsorb (ad), i.e., condense, on the interior surfaces of the deposition system 1. The accumulation of material on these surfaces can cause problems from one substrate to the next, such as process repeatability. Alternatively, for example, $Ru_3(CO)_{12}$ can condense on the internal surfaces of the deposition system 1, viz.

$$Ru_3(CO)_{12}(g) \Leftrightarrow Ru_3(CO)_{12}(ad) \quad (3).$$

In summary, low vapor pressure of some ruthenium carbonyl precursors (e.g., $Ru_3(CO)_{12}$) and the small process window, results in very low deposition rate of a metal layer on the substrate 25.

Adding a CO gas to the ruthenium carbonyl precursor vapor can reduce the above-mentioned problems that limit the delivery of the ruthenium carbonyl precursor to the substrate. Thus, according to embodiments of the invention, the CO gas is added to the ruthenium carbonyl precursor vapor to reduce dissociation of the ruthenium carbonyl precursor vapor in the gas line, thereby shifting the equilibrium in Equation (1) to the left and reducing premature decomposition of the ruthenium carbonyl precursor in the vapor precursor delivery system 40 prior to delivery of the ruthenium carbonyl precursor to the process chamber 10. The addition of the CO gas to the ruthenium carbonyl precursor vapor allows for increasing the vaporization temperature from approximately 40° C. to approximately 100° C., or higher. The elevated temperature increases the vapor pressure of the ruthenium carbonyl precursor, resulting in increased delivery of the ruthenium carbonyl precursor to the process chamber and, hence, increased deposition rate of the metal on the substrate 25. Furthermore, flowing a mixture of Ar and the CO gas over or through the ruthenium carbonyl precursor reduces premature decomposition of the ruthenium carbonyl precursor.

According to an embodiment of the invention, the addition of CO gas to a $Ru_3(CO)_{12}$ precursor vapor allows for maintaining the $Ru_3(CO)_{12}$ precursor vaporization temperature from approximately 40° C. to approximately 150° C. Alternately, the vaporization temperature can be maintained at approximately 60° C. to approximately 90° C.

Since the addition of the CO gas to the ruthenium carbonyl precursor vapor increases the thermal stability of the ruthenium carbonyl precursor vapor, the relative concentration of the ruthenium carbonyl precursor vapor to the CO gas in the process gas can be utilized to control the decomposition rate of the ruthenium carbonyl precursor on the substrate 25 at a certain substrate temperature. Furthermore, the substrate temperature can be utilized to control the decomposition rate (and thereby the deposition rate) of the metal on the substrate 25. As those skilled in the art will readily appreciate, the amount of CO gas and the substrate temperature can easily be varied to allow for a desired vaporization temperature of the ruthenium carbonyl precursor and for achieving a desired deposition rate of the ruthenium carbonyl precursor on the substrate 25. According to embodiments of the invention, the amount of CO gas in the process gas can be controlled by the CO gas flow and the inert gas flow.

Furthermore, the amount of CO gas in the process gas can be selected so that Ru deposition on the substrate 25 from a ruthenium carbonyl precursor occurs in a kinetic-limited temperature regime (also commonly referred to as a reaction rate limited temperature regime). For example, the amount of CO gas in the process gas can be increased until the Ru deposition process is observed to occur in a kinetic-limited temperature regime. A kinetic-limited temperature regime refers to the range of deposition conditions where the deposition rate of a chemical vapor deposition process is limited by the kinetics of the chemical reactions at the substrate surface, typically characterized by a strong dependence of deposition rate on temperature. Unlike the kinetic-limited temperature regime, a mass-transfer limited regime is normally observed at higher substrate temperatures and includes a range of deposition conditions where the deposition rate is limited by the flux of chemical reactants to the substrate surface. A mass-transfer limited regime is characterized by a strong dependence of deposition rate on ruthenium carbonyl precursor flow rate and is independent of deposition temperature. Metal deposition in the kinetic-limited regime normally results in good step coverage of the metal layer on patterned substrates. Step coverage of a metal layer is herein defined as the metal layer thickness on the sidewall (vertical portion) of a feature divided by the metal layer thickness away from the feature. Since the metal layer thickness can vary at different locations of the sidewall, the location where the thickness is lowest is usually selected to calculate the step coverage.

Still referring to FIG. 1A, the deposition system 1 can further include a control system 80 configured to operate and control the operation of the deposition system 1. The control system 80 is coupled to the process chamber 10, the substrate holder 20, the substrate temperature control system 22, the chamber temperature control system 12, the vapor distribution system 30, the vapor precursor delivery system 40, the metal precursor vaporization system 50, the vaporization temperature control system 54, and the gas supply system 60.

Figure 1B:
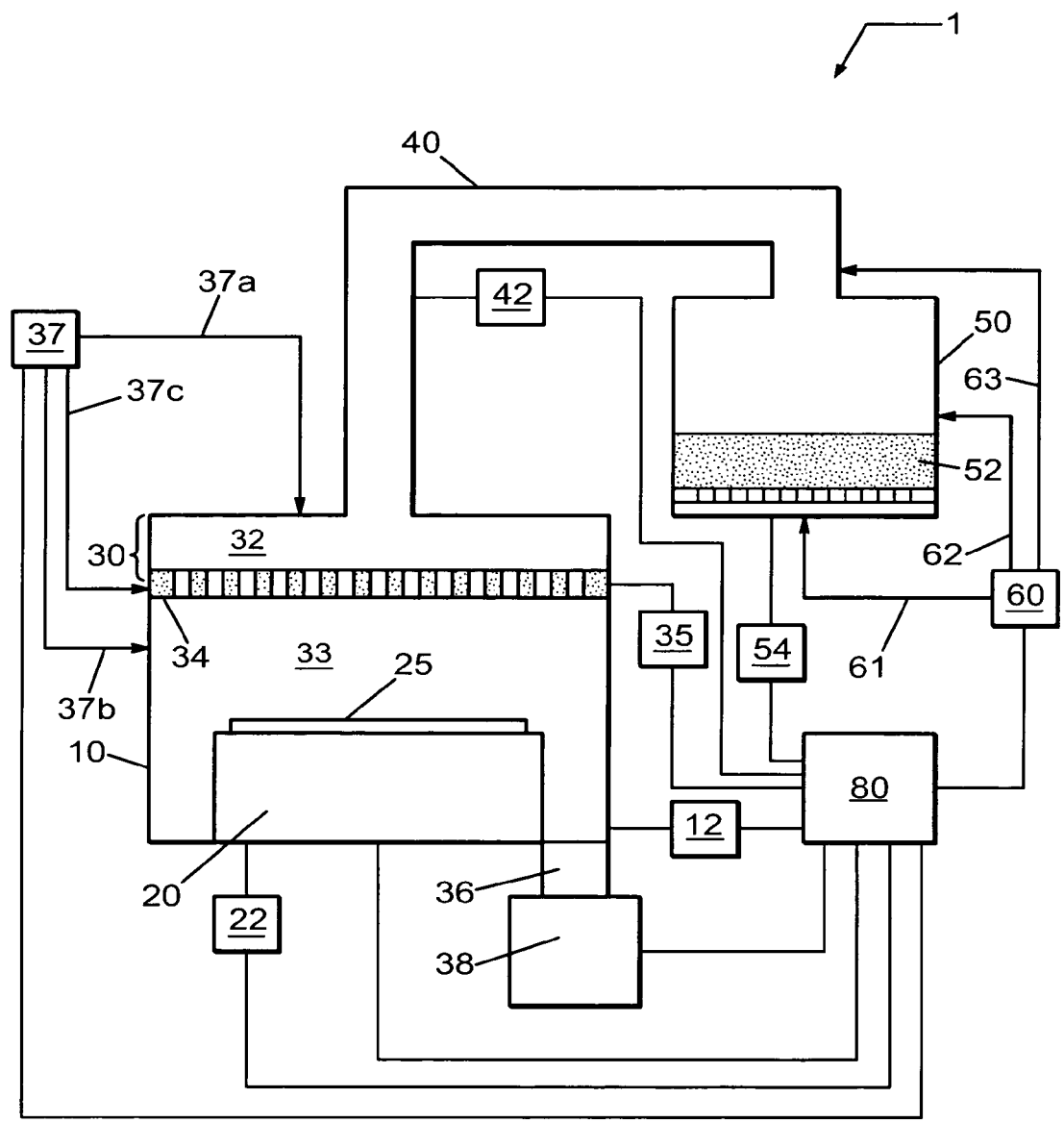
FIG. 1B depicts a schematic view of a deposition system according to another embodiment of the invention.

FIG. 1B depicts a schematic view of a deposition system according to another embodiment of the invention. In addition to the components of FIG. 1A described above, the deposition system 1 contains a dilution gas source 37 coupled to the process chamber 10. The dilution gas source 37 is configured to add a dilution gas to the process gas containing the metal-carbonyl precursor vapor and the CO gas. According to an embodiment of the invention, the dilution gas can contain an inert gas (e.g., $N_2$, a noble gas (i.e., He, Ne, Ar, Kr, or Xe), or a combination thereof), a CO gas, or a combination thereof. As shown in FIG. 1B, the dilution gas source 37 can be coupled to the vapor distribution system 30 via feed line 37a and configured to add the dilution gas to the process gas in the vapor distribution plenum 32 before the process gas passes through the vapor distribution plate 34 into the processing zone 33. Alternately, the dilution gas source 37 can be coupled to the process chamber 10 via feed line 37b and configured to add the dilution gas to the process gas in the processing zone 33 above the substrate 25 after the process gas passes through the vapor distribution plate 34. Still alternately, the dilution gas source 37 can be coupled to the vapor distribution system 30 via feed line 37c and configured to add the dilution gas to the process gas in the distribution plate 34. As will be appreciated by those skilled in the art, the dilution gas can be added to the process gas at other locations in the vapor distribution system 30 and the process chamber 10 without departing from the scope of the invention. According to embodiments of the invention, the dilution gas can be utilized to control the CO partial pressure in the process chamber 10. A partial pressure is the pressure that a component of a gaseous mixture would have if it alone occupied the same volume at the same temperature as the mixture. The CO partial pressure in the process chamber is calculated from the relative CO gas flow (e.g., CO gas flow divided by the combined inert gas and CO gas flow).

Figure 2A:
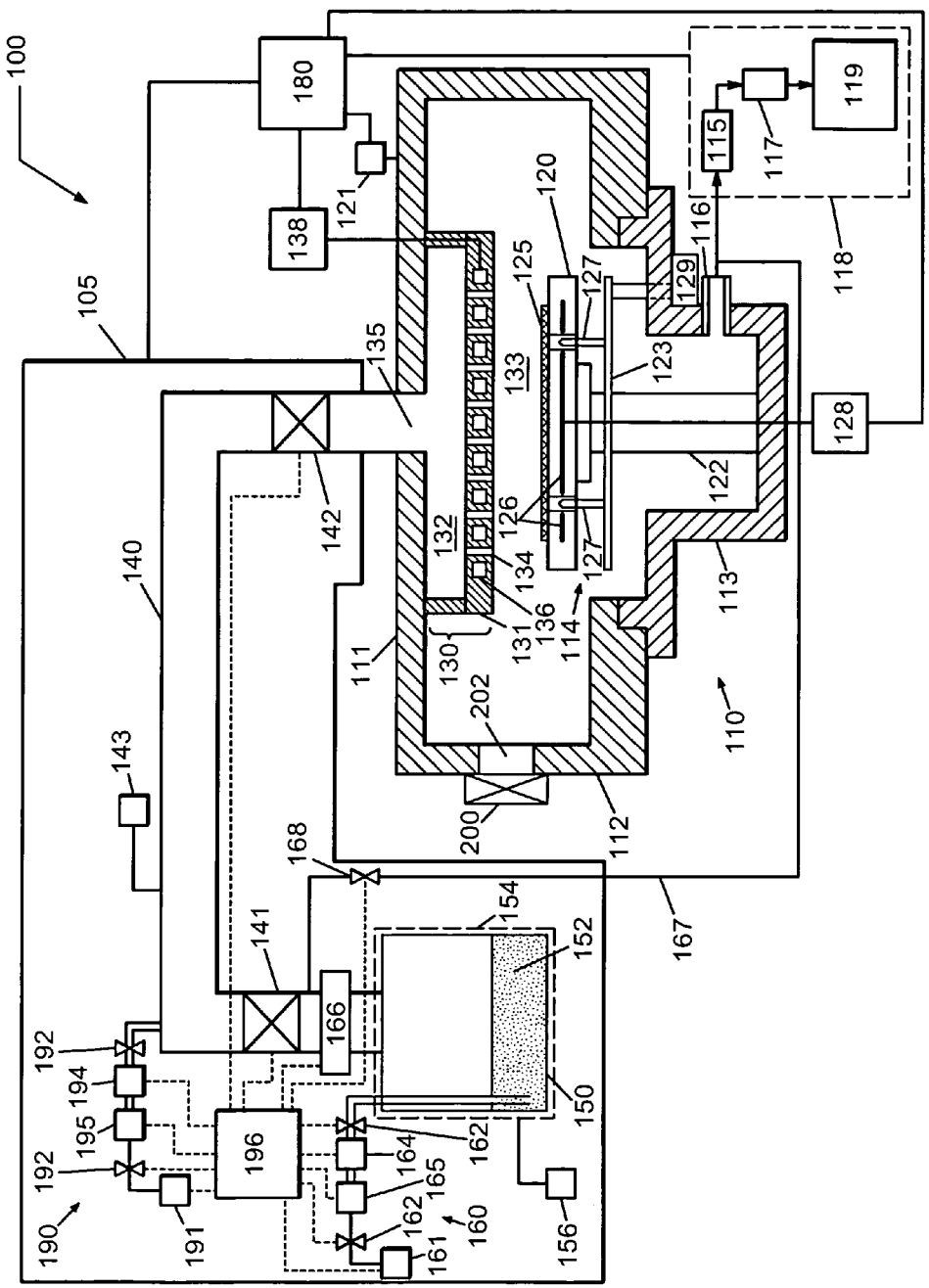
FIG. 2A depicts a schematic view of a deposition system according to an embodiment of the invention.

In another embodiment, FIG. 2A illustrates a deposition system 100 for depositing a metal layer, such as a Ru layer, on a substrate. The deposition system 100 comprises a process chamber 110 having a substrate holder 120 configured to support a substrate 125 upon which the Ru layer is formed. The process chamber 110 is coupled to a precursor delivery system 105 having metal precursor vaporization system 150 configured to store and vaporize a ruthenium carbonyl precursor 152, and a vapor precursor delivery system 140 configured to transport the vapor of the ruthenium carbonyl precursor 152 to the process chamber 110.

The process chamber 110 comprises an upper chamber section 111, a lower chamber section 112, and an exhaust chamber 113. An opening 114 is formed within lower chamber section 112, where bottom section 112 couples with exhaust chamber 113.

Still referring to FIG. 2A, substrate holder 120 provides a horizontal surface to support substrate (or wafer) 125, which is to be processed. The substrate holder 120 can be supported by a cylindrical support member 122, which extends upward from the lower portion of exhaust chamber 113. Furthermore, the substrate holder 120 comprises a heater 126 coupled to substrate holder temperature control system 128. The heater 126 can, for example, include one or more resistive heating elements. Alternately, the heater 126 can, for example, include a radiant heating system, such as a tungsten-halogen lamp. The substrate holder temperature control system 128 can include a power source for providing power to the one or more heating elements, one or more temperature sensors for measuring the substrate temperature or the substrate holder temperature, or both, and a controller configured to perform at least one of monitoring, adjusting, or controlling the temperature of the substrate 125 or substrate holder 120.

During processing, the heated substrate 125 can thermally decompose the ruthenium carbonyl precursor vapor, and enable deposition of a Ru layer on the substrate 125. The substrate holder 120 is heated to a pre-determined temperature that is suitable for depositing the desired Ru layer or other metal layer onto the substrate 125. Additionally, a heater (not shown) coupled to a chamber temperature control system 121 can be embedded in the walls of process chamber 110 to heat the chamber walls to a pre-determined temperature. The heater can maintain the temperature of the walls of process chamber 110 from about 40° C. to about 150° C., or from about 40° C. to about 80° C. A pressure gauge (not shown) is used to measure the process chamber pressure. According to an embodiment of the invention, the process chamber pressure can be between about 1 mTorr and about 200 mTorr. Alternately, the process chamber pressure can be between about 2 mTorr and about 50 mTorr.

Also shown in FIG. 2A, a vapor distribution system 130 is coupled to the upper chamber section 111 of process chamber 110. Vapor distribution system 130 comprises a vapor distribution plate 131 configured to introduce precursor vapor from vapor distribution plenum 132 to a processing zone 133 above substrate 125 through one or more orifices 134.

Furthermore, an opening 135 is provided in the upper chamber section 111 for introducing a ruthenium carbonyl precursor vapor from vapor precursor delivery system 140 into vapor distribution plenum 132. Moreover, temperature control elements 136, such as concentric fluid channels configured to flow a cooled or heated fluid, are provided for controlling the temperature of the vapor distribution system 130, and thereby prevent the decomposition or condensation of the ruthenium carbonyl precursor inside the vapor distribution system 130. For instance, a fluid, such as water, can be supplied to the fluid channels from a vapor distribution temperature control system 138. The vapor distribution temperature control system 138 can include a fluid source, a heat exchanger, one or more temperature sensors for measuring the fluid temperature or vapor distribution plate temperature or both, and a controller configured to control the temperature of the vapor distribution plate 131 from about 20° C. to about 150° C. For a $Ru_3(CO)_{12}$ precursor, the temperature of the vapor distribution plate 131 can be maintained at or above a temperature of about 65° C. to avoid precursor condensation on the plate 131.

As illustrated in FIG. 2A, a metal precursor vaporization system 150 is configured to hold a ruthenium carbonyl precursor 152 and to evaporate (or sublime) the ruthenium carbonyl precursor 152 by elevating the temperature of the ruthenium carbonyl precursor. The terms "vaporization," "sublimation" and "evaporation" are used interchangeably herein to refer to the general formation of a vapor (gas) from a solid or liquid precursor, regardless of whether the transformation is, for example, from solid to liquid to gas, solid to gas, or liquid to gas. A precursor heater 154 is provided for heating the ruthenium carbonyl precursor 152 to maintain the ruthenium carbonyl precursor 152 at a temperature that produces a desired vapor pressure of ruthenium carbonyl precursor 152. The precursor heater 154 is coupled to a vaporization temperature control system 156 configured to control the temperature of the ruthenium carbonyl precursor 152. For example, the precursor heater 154 can be configured to adjust the temperature of the ruthenium carbonyl precursor 152 from about 40° C. to about 150° C., or from about 60° C. to about 90° C.

As the ruthenium carbonyl precursor 152 is heated to cause evaporation (or sublimation), a CO-containing gas can be passed over or through the ruthenium carbonyl precursor 152, or any combination thereof. The CO-containing gas contains CO and optionally an inert carrier gas, such as $N_2$, or a noble gas (i.e., He, Ne, Ar, Kr, Xe). According to an embodiment of the invention, a CO gas can be added to the inert gas. Alternately, other embodiments contemplate the CO gas replacing the inert gas. For example, a gas supply system 160 is coupled to the metal precursor vaporization system 150, and it is configured to, for instance, flow the CO gas, the inert gas, or both, over or through the ruthenium carbonyl precursor 152. Although not shown in FIG. 2A, gas supply system 160 can also or alternatively be coupled to the vapor precursor delivery system 140 to supply the carrier gas and/or CO gas to the vapor of the metal precursor 152 as or after it enters the vapor precursor delivery system 140. The gas supply system 160 can comprise a gas source 161 containing an inert carrier gas, a CO gas, or a mixture thereof, one or more control valves 162, one or more filters 164, and a mass flow controller 165. For instance, the mass flow rate of the CO-containing gas can range from approximately 0.1 sccm to approximately 1000 sccm.

Additionally, a sensor 166 is provided for measuring the total gas flow from the metal precursor vaporization system 150. The sensor 166 can, for example, comprise a mass flow controller, and the amount of ruthenium carbonyl precursor vapor delivered to the process chamber 110 can be determined using sensor 166 and mass flow controller 165. Alternately, the sensor 166 can comprise a light absorption sensor to measure the concentration of the ruthenium carbonyl precursor in the gas flow to the process chamber 110.

A bypass line 167 can be located downstream from sensor 166, and it can connect the vapor delivery system 140 to an exhaust line 116. Bypass line 167 is provided for evacuating the vapor precursor delivery system 140, and for stabilizing the supply of the ruthenium carbonyl precursor vapor to the process chamber 110. In addition, a bypass valve 168, located downstream from the branching of the vapor precursor delivery system 140, is provided on bypass line 167.

Referring still to FIG. 2A, the vapor precursor delivery system 140 comprises a high conductance vapor line having first and second valves 141 and 142, respectively. Additionally, the vapor precursor delivery system 140 can further comprise a vapor line temperature control system 143 configured to heat the vapor precursor delivery system 140 via heaters (not shown). The temperatures of the vapor lines can be controlled to avoid condensation of the ruthenium carbonyl precursor vapor in the vapor line. The temperature of the vapor lines can be controlled from about 20° C. to about 100° C., or from about 40° C. to about 90° C.

Moreover, a CO gas can be supplied from a gas supply system 190. For example, the gas supply system 190 is coupled to the vapor precursor delivery system 140, and it is configured to, for instance, mix the CO gas with the ruthenium carbonyl precursor vapor in the vapor precursor delivery system 140, for example, downstream of valve 141. The gas supply system 190 can comprise a CO gas source 191, one or more control valves 192, one or more filters 194, and a mass flow controller 195. For instance, the mass flow rate of CO gas can range from approximately 0.1 sccm (standard cubic centimeters per minute) to approximately 1000 sccm.

Mass flow controllers 165 and 195, and valves 162, 192, 168, 141, and 142 are controlled by controller 196, which controls the supply, shutoff, and the flow of the inert carrier gas, the CO gas, and the ruthenium carbonyl precursor vapor. Sensor 166 is also connected to controller 195 and, based on output of the sensor 166, controller 195 can control the carrier gas flow through mass flow controller 165 to obtain the desired ruthenium carbonyl precursor flow to the process chamber 110.

As illustrated in FIG. 2A, the exhaust line 116 connects exhaust chamber 113 to pumping system 118. A vacuum pump 119 is used to evacuate process chamber 110 to the desired degree of vacuum, and to remove gaseous species from the process chamber 110 during processing. An automatic pressure controller (APC) 115 and a trap 117 can be used in series with the vacuum pump 119. The vacuum pump 119 can include a turbo-molecular pump (TMP) capable of a pumping speed up to 500 liters per second (and greater). Alternately, the vacuum pump 119 can include a dry roughing pump. During processing, the process gas can be introduced into the process chamber 110, and the chamber pressure can be adjusted by the APC 115. The APC 115 can comprise a butterfly-type valve or a gate valve. The trap 117 can collect unreacted ruthenium carbonyl precursor material and by-products from the process chamber 110.

Referring back to the substrate holder 120 in the process chamber 110, as shown in FIG. 2A, three substrate lift pins 127 (only two are shown) are provided for holding, raising, and lowering the substrate 125. The substrate lift pins 127 are coupled to plate 123, and can be lowered to below the upper surface of substrate holder 120. A drive mechanism 129 utilizing, for example, an air cylinder provides means for raising and lowering the plate 123. Substrate 125 can be transferred into and out of process chamber 110 through gate valve 200 and chamber feed-through passage 202 via a robotic transfer system (not shown), and received by the substrate lift pins 127. Once the substrate 125 is received from the transfer system, it can be lowered to the upper surface of the substrate holder 120 by lowering the substrate lift pins 127.

Still referring to FIG. 2A, a controller 180 includes a microprocessor, a memory, and a digital I/O port capable of generating control voltages sufficient to communicate and activate inputs of the processing system 100 as well as monitor outputs from the processing system 100. Moreover, the processing system controller 180 is coupled to and exchanges information with process chamber 110; precursor delivery system 105, which includes controller 196, vapor line temperature control system 143, and vaporization temperature control system 156; vapor distribution temperature control system 138; vacuum pumping system 118; and substrate temperature control system 128. In the vacuum pumping system 118, the controller 180 is coupled to and exchanges information with the automatic pressure controller 115 for controlling the pressure in the process chamber 110. A program stored in the memory is utilized to control the aforementioned components of deposition system 100 according to a stored process recipe. One example of processing system controller 180 is a DELL PRECISION WORKSTATION 610™, available from Dell Corporation, Dallas, Tex.

The controller 180 may be implemented as a general-purpose computer system that performs a portion or all of the microprocessor-based processing steps of the invention in response to a processor executing one or more sequences of one or more instructions contained in a memory. Such instructions may be read into the controller memory from another computer readable medium, such as a hard disk or a removable media drive. One or more processors in a multiprocessing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 180 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, the present invention includes software for controlling the controller 180, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing the invention.

The computer code devices of the present invention may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 180 for execution. A computer readable medium may take many forms, including but not limited to, non-volatile media, volatile media, and transmission media. Non-volatile media includes, for example, optical disks, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to the processor of the controller for execution. For example, the instructions may initially be carried on a magnetic disk of a remote computer. The remote computer can load the instructions for implementing all or a portion of the present invention remotely into a dynamic memory and send the instructions over a network to the controller 180.

The controller 180 may be locally located relative to the deposition system 100, or it may be remotely located relative to the deposition system 100. For example, the controller 180 may exchange data with the deposition system 100 using at least one of a direct connection, an intranet, the Internet and a wireless connection. The controller 180 may be coupled to an intranet at, for example, a customer site (i.e., a device maker, etc.), or it may be coupled to an intranet at, for example, a vendor site (i.e., an equipment manufacturer). Additionally, for example, the controller 180 may be coupled to the Internet. Furthermore, another computer (i.e., controller, server, etc.) may access, for example, the controller 180 to exchange data via at least one of a direct connection, an intranet, and the Internet. As also would be appreciated by those skilled in the art, the controller 180 may exchange data with the deposition system 100 via a wireless connection.

As described above, the amount of CO gas in a process gas containing a ruthenium carbonyl precursor can be selected such that Ru deposition occurs in a kinetic-limited temperature regime, where a high step coverage over patterned substrates can be observed. For example, the amount of CO gas in the process gas can be increased until the Ru deposition process is observed to occur in the kinetic-limited temperature regime. In addition, or in the alternative, the substrate temperature can selected such that the Ru deposition process occurs in the kinetic-limited temperature regime or the mass-transfer limited regime, where a mass-transfer limited regime is normally observed at higher substrate temperatures.

Figure 2B:
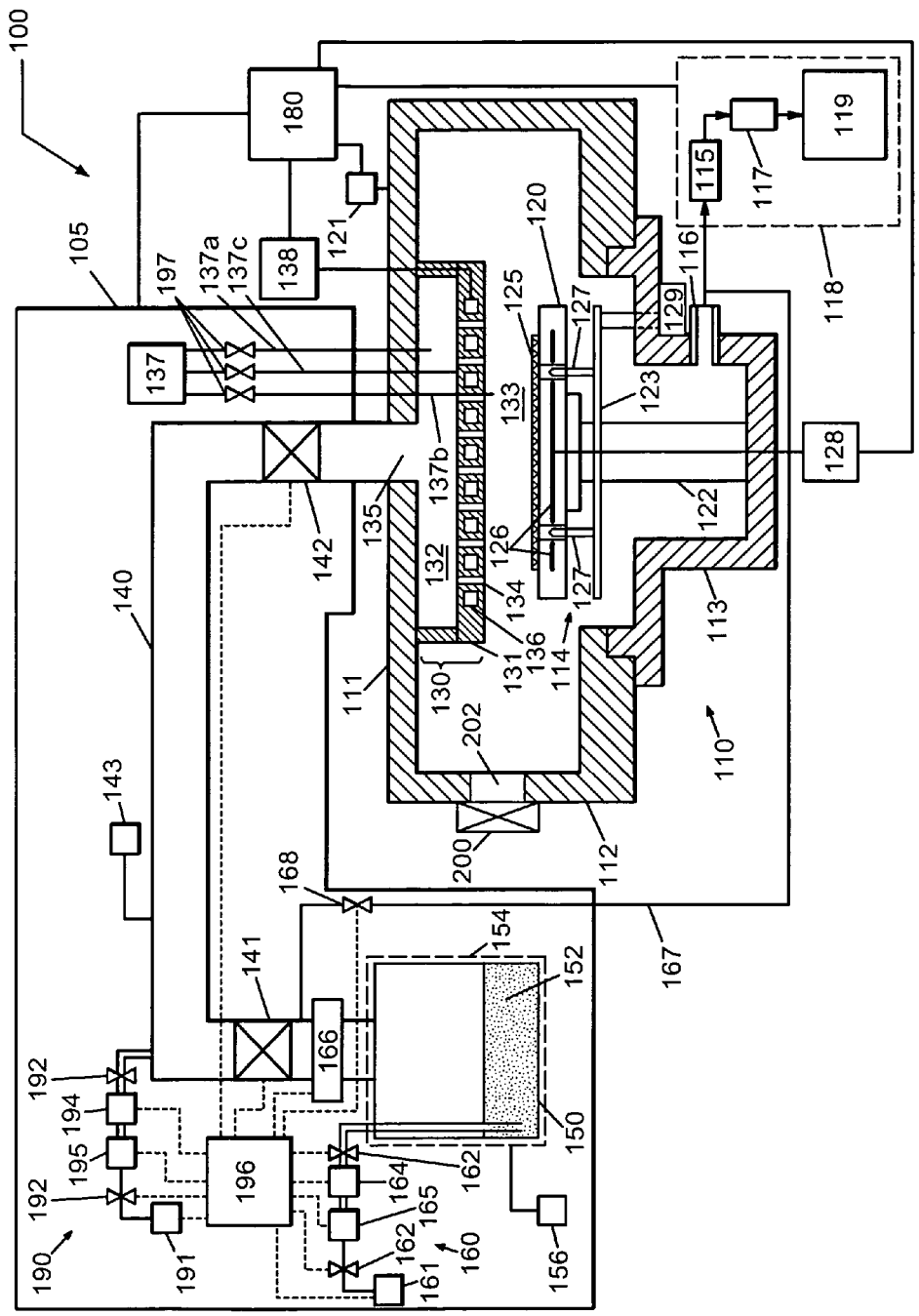
FIG. 2B depicts a schematic view of a deposition system according to another embodiment of the invention.

FIG. 2B depicts a schematic view of a deposition system according to another embodiment of the invention. In addition to the components of FIG. 2A described above, the deposition system 100 contains a dilution gas source 137 coupled to the process chamber 110. The dilution gas source 137 is configured to add a dilution gas to the process gas containing the metal-carbonyl precursor vapor and the CO gas using feed lines 137a, 137b, and/or 137c, valves 197, one or more filters (not shown), and a mass flow controller (not shown). According to an embodiment of the invention, the dilution gas can contain an inert gas, a CO gas, or a combination thereof. The inert gas can, for example be a noble gas or $N_2$. As shown in FIG. 2B, the dilution gas source 137 can be coupled to the vapor distribution system 130 of process chamber 110 and is configured to add the dilution gas to the process gas in the vapor distribution plenum 132 via feed line 137a before the process gas passes through the vapor distribution plate 131 into the processing zone 133 above the substrate 125, or the dilution gas source 137 can be configured to add the dilution gas to the process gas inside the vapor distribution plate 131 via feed line 137c. Alternately, the dilution gas source 137 can be coupled to the process chamber 110 and is configured to add the dilution gas to the process gas in the processing zone 133 via feed line 137b after the process gas passes through the vapor distribution plate 131. As will be appreciated by those skilled in the art, the dilution gas can be added to the process gas at other locations in the process chamber 110 without departing from the scope of the invention. Analogously as described above in reference to FIG. 1B, the dilution gas can be utilized to control the CO partial pressure in the process chamber 110.

Figure 3A:
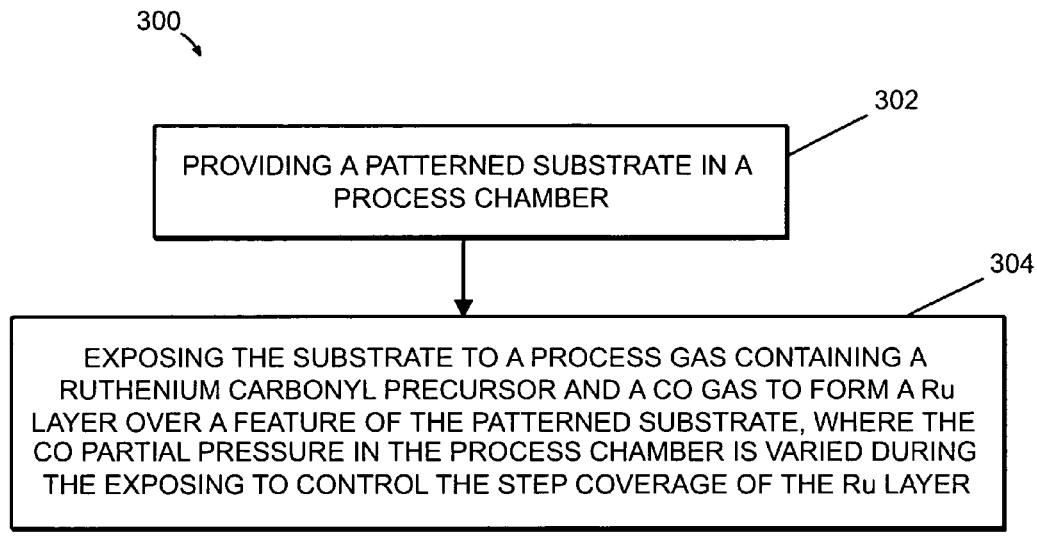
FIG. 3A illustrates a method of depositing a Ru layer on a patterned substrate according to an embodiment of the invention.

FIG. 3A illustrates a method of depositing a Ru layer on a patterned substrate according to an embodiment of the invention. The method 300 includes, at 302, providing a patterned substrate in a process chamber of a deposition system. For example, the deposition system can include the depositions systems described in FIGS. 1A, 1B, 2A, and 2B. The substrate can, for example, be a Si substrate. A Si substrate can be of n- or p-type, depending on the type of device being formed. The substrate can be of any size, for example a 200 mm substrate, a 300 mm substrate, or an even larger substrate. According to an embodiment of the invention, the patterned substrate contains a feature. The feature can, for example, contain one or more vias or trenches, or combinations thereof. The vias and trenches can, for example, have openings that are in the sub-micron range, for example less than 65 nm or less than 45 nm. The vias and trenches can have high aspect ratios (depth/width), for example between about 2 and about 10, but embodiments of the invention are not limited to these aspect ratios.

At 304, the substrate is exposed to a process gas containing a ruthenium carbonyl precursor and CO gas to form a Ru layer over a feature of the patterned substrate, where the CO partial pressure in the process chamber is varied during the exposing to control the step coverage of the Ru layer over the feature. According to an embodiment of the invention, the CO partial pressure in the process chamber can be between about 1 mTorr and about 100 mTorr. According to an embodiment of the invention, the total gas pressure in the process chamber can be between about 5 mTorr and about 500 mTorr.

In addition to varying the CO partial pressure in the process chamber during the exposing, the substrate temperature may be varied during the exposing, or, alternately, the temperature of the substrate can be maintained substantially constant during the exposing. According to an embodiment of the invention, the substrate can be maintained at a temperature between about 100° C. and about 300° C. during the exposing. Alternatively, rather than varying the CO partial pressure at 304, the substrate temperature may be varied while the CO partial pressure is maintained substantially constant.

According to another embodiment of the invention, the Ru layer can contain a plurality of Ru sublayers and the step coverage of each Ru sublayer can be controlled by selecting a corresponding CO partial pressure in the process chamber. Each sublayer can, for example, have a thickness between about 0.5 nm and about 50 nm. According to an embodiment of the invention, at least one Ru sublayer can have a step coverage greater than about 50% and at least one Ru sublayer can have a step coverage less than about 50%. According to another embodiment of the invention, at least one Ru sublayer can have a step coverage greater than about 80% and at least one Ru sublayer can have a step coverage less than about 10%. According to one embodiment of the invention, the Ru layer can contain two Ru sublayers, e.g., a first Ru sublayer formed over a feature of the patterned substrate and a second Ru sublayer formed over the first Ru sublayer. According to one embodiment of the invention, the first Ru sublayer can have a higher step coverage than the second Ru sublayer. Alternatively, the first Ru sublayer can have a lower step coverage than the second Ru sublayer.

According to an embodiment of the invention, the Ru layer can contain a first and second Ru sublayer, where the first Ru sublayer is deposited over the feature while maintaining a first CO partial pressure in the process chamber and the first Ru sublayer has a first step coverage, and where the second Ru sublayer is deposited over the feature while maintaining a second CO partial pressure different from the first CO partial pressure in the process chamber and the second Ru sublayer has a second step coverage different from the first step coverage. According to an embodiment of the invention, the first CO partial pressure is greater than the second CO partial pressure and the first step coverage is greater than the second step coverage. According to one embodiment of the invention, the first and second CO partial pressures are between about 1 mTorr and about 20 mTorr. According to an embodiment of the invention, at least one of the first and second Ru sublayers are deposited in a kinetic-limited temperature regime. According to an embodiment of the invention, the substrate can be maintained at a first temperature during deposition of the first Ru sublayer and the substrate can be maintained at a second temperature during deposition of the second Ru sublayer, where the second temperature is different from the first temperature. According to an embodiment of the invention, the first temperature can be between about 100° C. and about 220° C. and the second temperature can be about 180° C. and about 300° C.

According to an embodiment of the invention, the Ru layer can contain a first and second Ru sublayer, where the first Ru sublayer is deposited over the feature while maintaining a first CO partial pressure in the process chamber and the first Ru sublayer has a first step coverage, and where the second Ru sublayer is deposited over the first Ru sublayer while maintaining a second CO partial pressure lower than first CO partial pressure in the process chamber and the second Ru sublayer has a step coverage that is lower than the first step coverage. According to one embodiment of the invention, the first CO partial pressure is between about 10 mTorr and about 20 mTorr and the second CO partial pressure is between about 1 mTorr and about 10 mTorr.

Figure 3B:
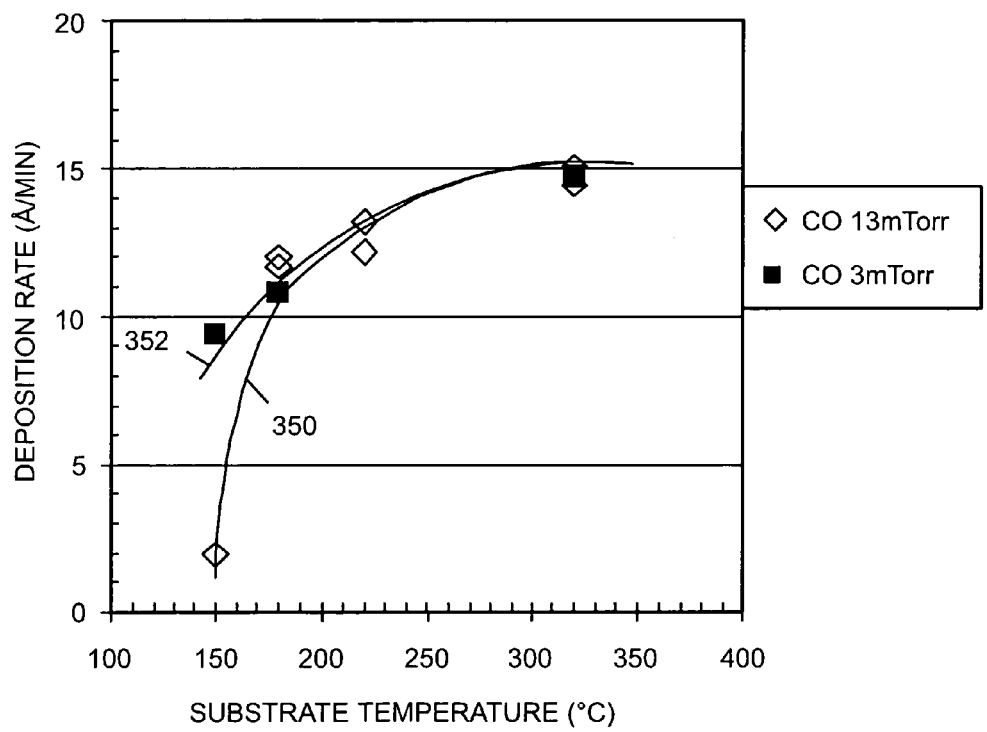
FIG. 3B shows the deposition rate of Ru onto a substrate as a function of wafer temperature for different CO partial pressures according to an embodiment of the invention.

FIG. 3B shows the deposition rate of Ru onto a substrate as a function of substrate temperature for different CO partial pressures according to an embodiment of the invention. Traces 350 and 352 show the measured deposition rates of Ru obtained for CO partial pressures of 13 mTorr and 3 mTorr in the process chamber, respectively. Other process parameters included total chamber pressure of 15 mTorr, gas flows of 50 sccm Ar and 300 sccm CO for the CO partial pressure of 13 mTorr, gas flows of 280 sccm Ar and 70 sccm CO for the CO partial pressure of 3 mTorr, the temperature of the metal precursor container containing $Ru_3CO_{12}$ was maintained at 80° C., and the temperature of the vapor distribution plate (showerhead) was maintained at 70° C. Trace 350 (13 mTorr CO) shows a kinetic-limited temperature regime below about 180° C. and a feed rate limited regime above about 180° C. Trace 352 (3 mTorr CO) shows that the kinetic-limited temperature regime for Ru deposition shifts to lower substrate temperate compared to trace 350 (13 mTorr CO).

The step coverage of the Ru layers from trace 350 in FIG. 3B was measured. The Ru layers were deposited over a feature measuring 140 nm wide and having an aspect ratio of 3 (depth/width). The feature further contained a thin tantalum-containing layer (4 nm Ta on 2.5 nm TaN) deposited by ionized physical vapor deposition (IPVD). The step coverage was measured for Ru layers deposited at substrate temperatures of 320° C., 180° C., and 150° C. The step coverage was less than about 10% for substrate temperatures of 320° C. and 180° C., but greater than about 80% for a substrate temperature of 150° C. The Ru layers were about 35 nm thick away from the feature.

In summary, CO partial pressure in the process chamber and/or the substrate temperature can be used to control the step coverage of a Ru layer deposited from a process gas containing a ruthenium carbonyl precursor and a CO gas. The CO partial pressure can, for example, be reduced by adding an inert gas to the process gas. The inert gas can, for example, be added to the process gas "upstream" from the metal precursor vaporization system or "downstream" from the metal precursor vaporization system (e.g., in the process chamber). Furthermore, increasing the substrate temperature and/or decreasing the CO partial pressure in the chamber during Ru deposition decreases the step coverage of the Ru layer. According to embodiments of the invention, the substrate temperature, and the CO partial pressure in the process chamber, either alone or in combination with the substrate temperature, can be used to control the step coverage.

Reference is now made to FIGS. 4A-4L and FIGS. 5A-5B. FIGS. 4A-4L schematically show CO partial pressure in a process chamber and temperature of a substrate during formation of a Ru layer on a substrate according to embodiments of the invention. FIGS. 4A-4L schematically show CO partial pressure in a process chamber and temperature of the substrate during formation of a Ru layer containing a first and second Ru sublayer according to embodiments of the invention where the first Ru sublayer has a greater step coverage than the second Ru sublayer. FIGS. 5A-5B schematically show formation of a Ru layer on a patterned substrate containing a feature according to embodiments of the invention depicted in FIGS. 4A-4L. FIG. 5A schematically shows a patterned structure 500 containing a feature (e.g., a via) that includes a first metal layer 510 and a patterned layer 520 containing an opening 530. The patterned layer 520 can, for example, be a dielectric material. The patterned structure can further contain a barrier layer (not shown) formed on the exposed surface of the patterned layer 520 and the first metal layer 510. The barrier layer can, for example, be a tantalum-containing layer (e.g., Ta, TaN, or TaCN, or a combination thereof) or a tungsten-containing layer (e.g., W, or WN, or a combination thereof). A first Ru sublayer 540 is formed on patterned layer 520, and a second Ru sublayer 550 is formed on first sublayer 540. The Ru layer 560 is shown having the first Ru sublayer 540 with a greater step coverage than the second Ru sublayer 550.

Figure 4A:
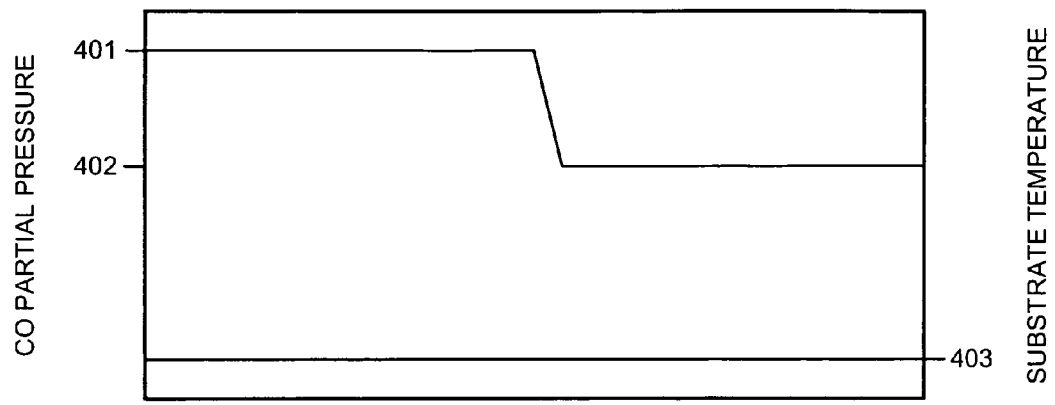
FIGS. 4A-4O schematically show CO partial pressure in a process chamber and temperature of the substrate during formation of a Ru layer on the substrate according to embodiments of the invention.
Figure 5A:
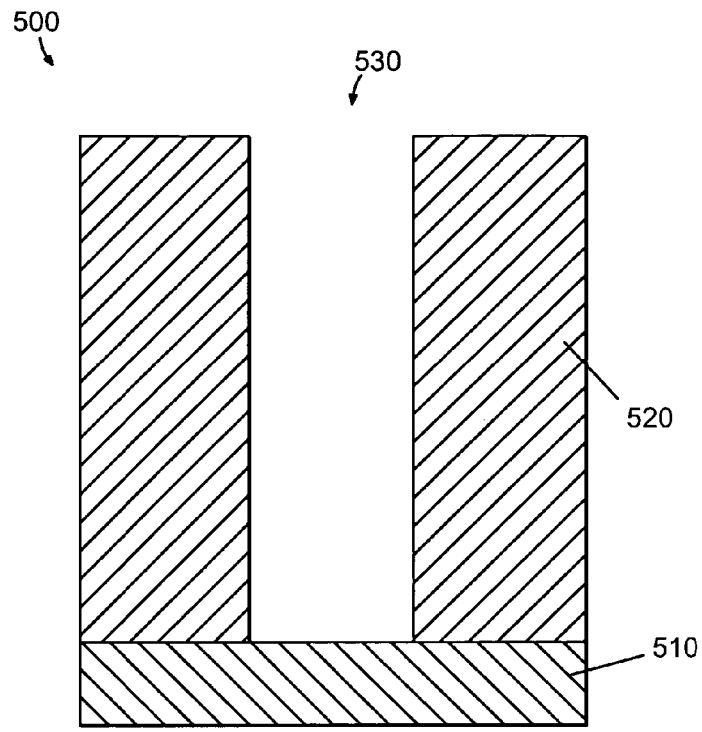
FIGS. 5A-5E schematically show formation of a Ru layer on a patterned substrate containing a feature according to embodiments of the invention.
Figure 5B:
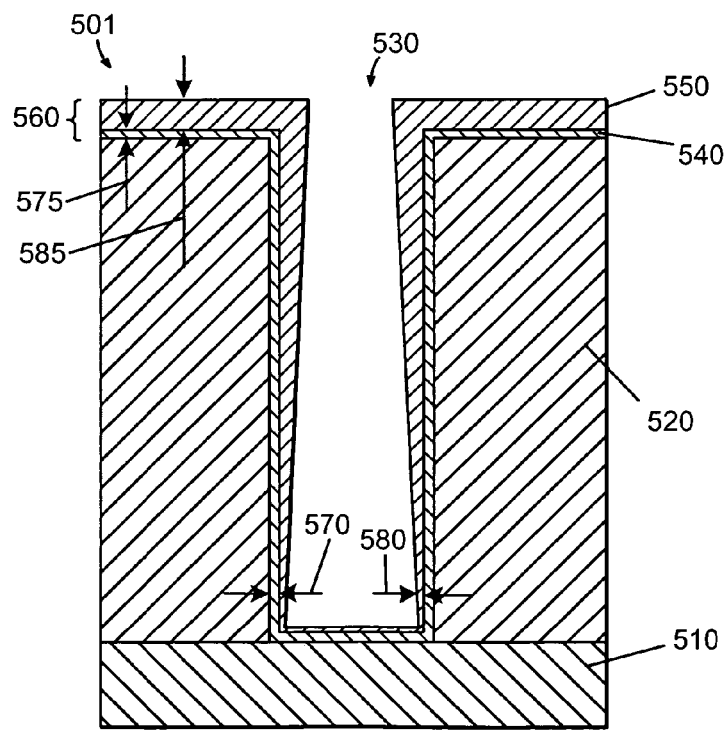

In FIG. 4A, a first Ru sublayer (e.g., Ru sublayer 540 in FIG. 5B) is deposited while maintaining a CO partial pressure 401 in the process chamber and maintaining the substrate at a temperature 403. Next, the CO partial pressure 401 is decreased to a CO partial pressure 402 and a second Ru sublayer (e.g., Ru sublayer 550 in FIG. 5B) is deposited onto the first Ru sublayer while maintaining the substrate at the temperature 403 and the CO partial pressure 402. In FIG. 5B, the first Ru sublayer 540 has a greater step coverage than the second Ru sublayer 550 (i.e., the thickness 570 divided by the thickness 575 for the first Ru sublayer 540 is greater than the thickness 580 divided by the thickness 585 for the second Ru sublayer 550).

Although not shown, the patterned structure 501 in FIG. 5B can be further processed by forming a Cu layer on the patterned structure 501 in an electroplating (EP) process and planarizing the structure 501 in a chemical mechanical polishing (CMP) process.

Figure 4B:
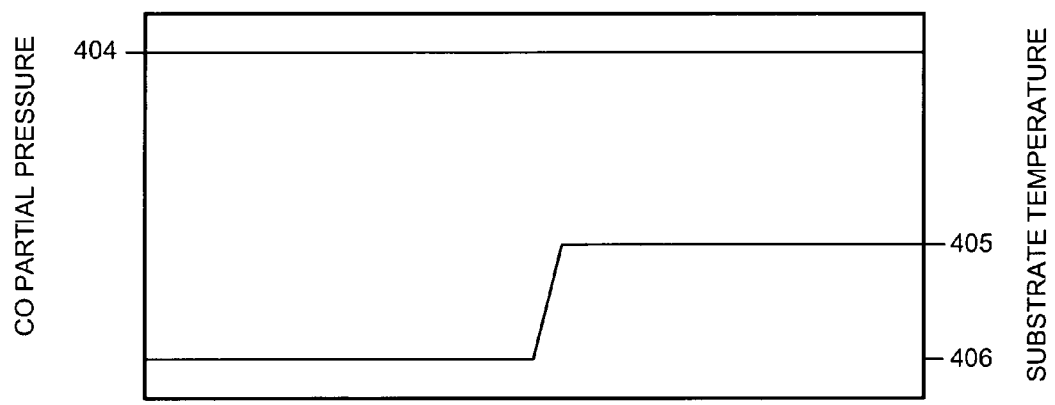

In FIG. 4B, a first Ru sublayer is deposited while maintaining a CO partial pressure 404 in the process chamber and maintaining the substrate at a temperature 406. Next, the temperature 406 is raised to a temperature 405 and a second Ru sublayer is deposited onto the first Ru sublayer while maintaining the substrate at the temperature 405 and the CO partial pressure 404. Again, a structure such as the patterned structure 501 in FIG. 5B will be formed, wherein the first Ru sublayer 540 deposited at the lower substrate temperature 406 has a greater step coverage than the second Ru sublayer 550 deposited at the higher temperature 405.

Figure 4C:
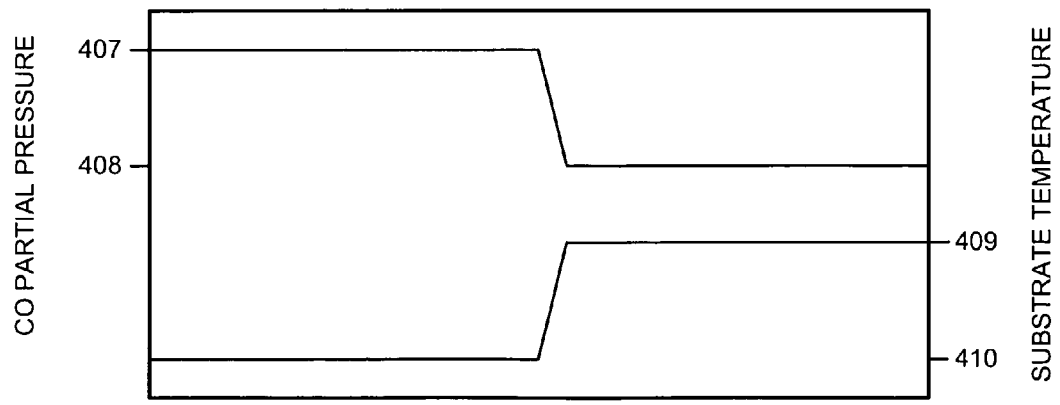

In FIG. 4C, a first Ru sublayer is deposited while maintaining a CO partial pressure 407 in the process chamber and maintaining the substrate at a temperature 410. Next, the CO partial pressure 407 is decreased to a CO partial pressure 408, the temperature of the substrate is raised to a temperature 409, and a second Ru sublayer is deposited onto the first Ru sublayer while maintaining the pressure 408 and the temperature 409.

Figure 4D:
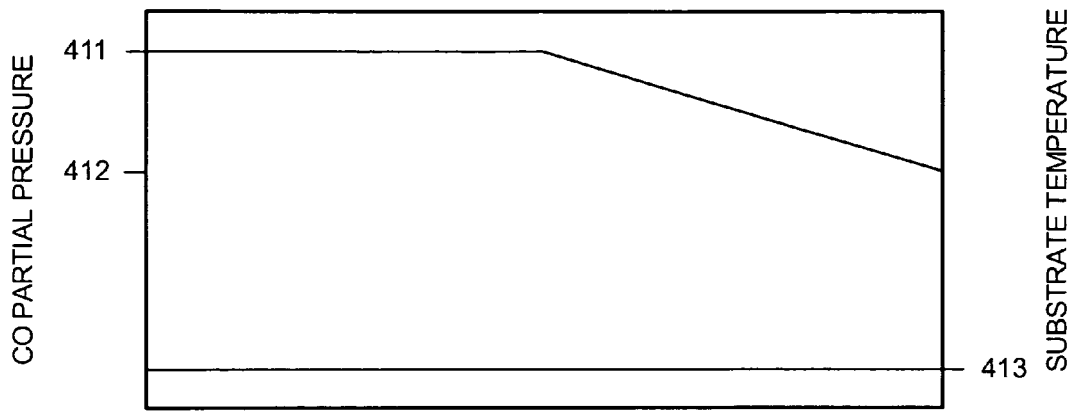

In FIG. 4D, a first Ru sublayer is deposited while maintaining a CO partial pressure 411 in the process chamber and maintaining the substrate at a temperature 413. Next, a second Ru sublayer is deposited on the first Ru sublayer while decreasing the CO partial pressure 411 to a CO partial pressure 412 and while maintaining the substrate at the temperature 413.

Figure 4E:
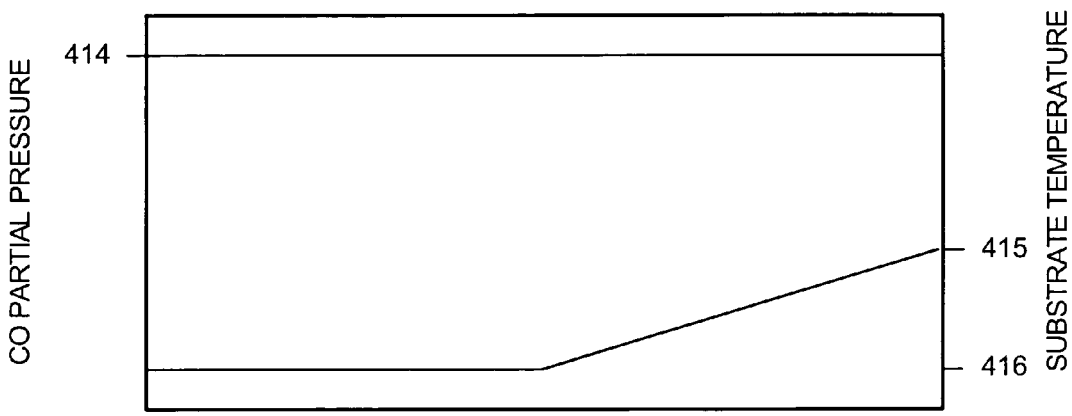

In FIG. 4E, a first Ru sublayer is deposited while maintaining a CO partial pressure 414 in the process chamber and maintaining the substrate at a temperature 416. Next, a second Ru sublayer is deposited onto the first Ru sublayer while increasing the temperature of the substrate to a temperature 415 and maintaining the CO partial pressure 414 in the process chamber.

Figure 4F:
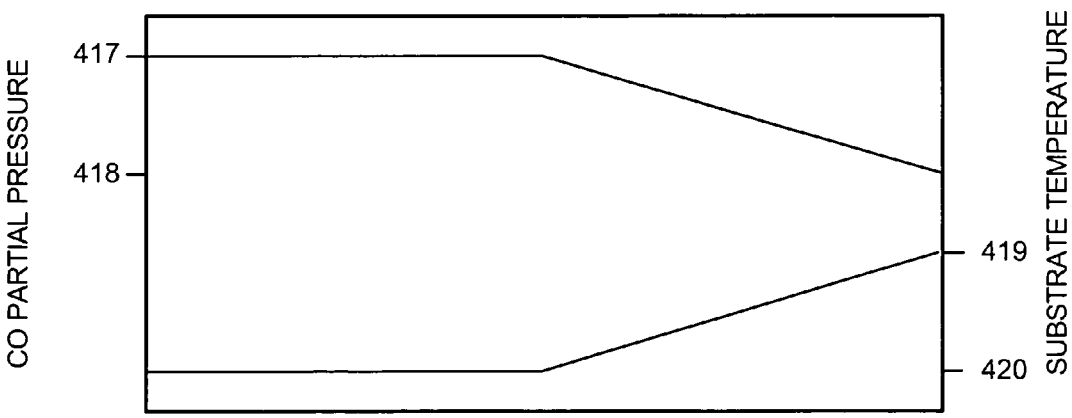

In FIG. 4F, a first Ru sublayer is deposited while maintaining a CO partial pressure 417 in the process chamber and maintaining the substrate at a temperature 420. Next, a second Ru sublayer is deposited onto the first Ru sublayer while increasing the temperature of the substrate to a temperature 419 and decreasing the CO partial pressure 417 to a CO partial pressure 418.

Figure 4G:
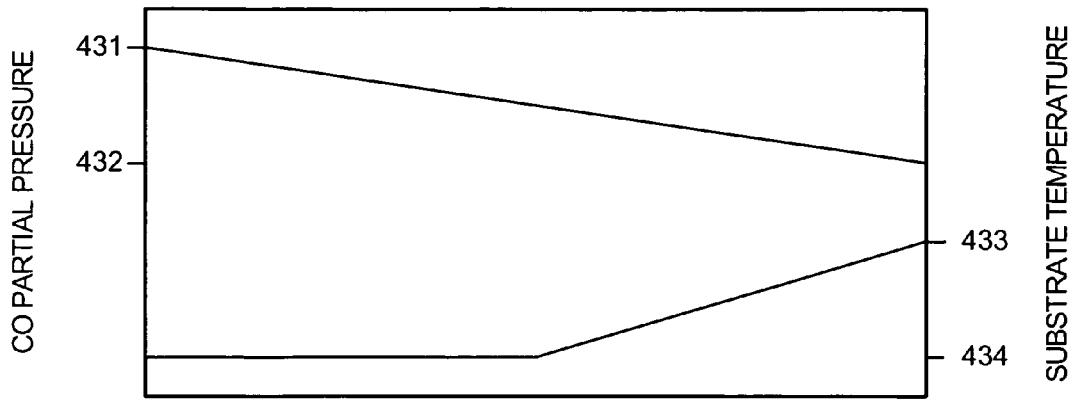

In FIG. 4G, a first Ru sublayer is deposited while maintaining the substrate at a temperature 434. Next, a second Ru sublayer is deposited onto the first Ru sublayer while increasing the temperature of the substrate to a temperature 433. The CO partial pressure is decreased from a CO partial pressure 431 to a CO partial pressure 432 during the deposition of the first and second Ru sublayers.

Figure 4H:
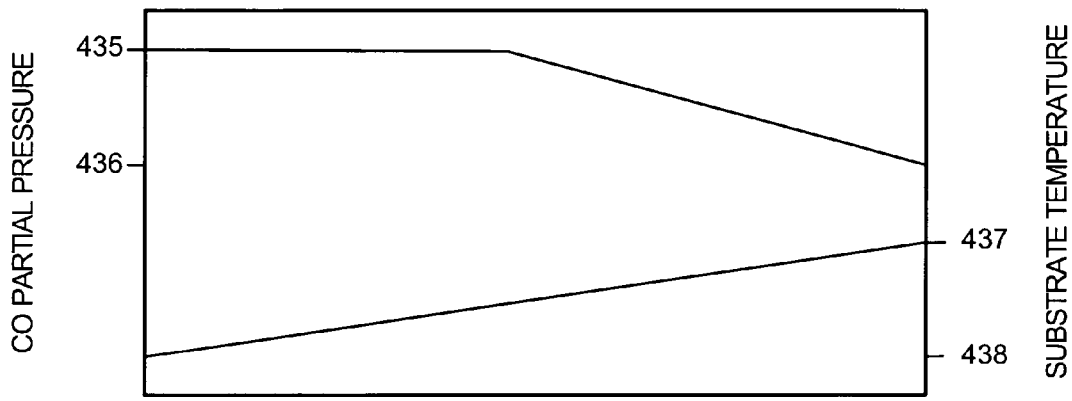

In FIG. 4H, a first Ru sublayer is deposited while maintaining a CO partial pressure 435 in the process chamber. Next, a second Ru sublayer is deposited onto the first Ru sublayer while decreasing the CO partial pressure 435 to a CO partial pressure 436. The substrate temperature is increased from a temperature 438 to a temperature 437 during the deposition of the first and second Ru sublayers.

Figure 4I:
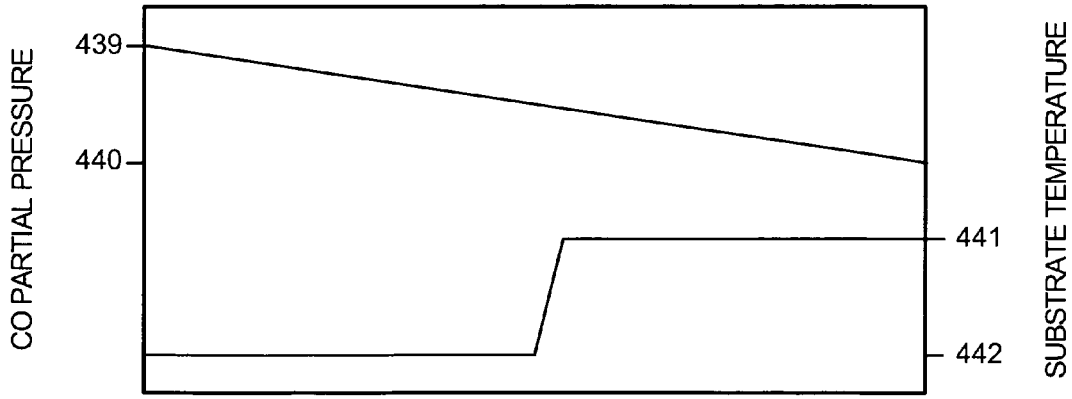

In FIG. 4I, a first Ru sublayer is deposited while maintaining the substrate at a temperature 442. Next, the substrate temperature is raised to a temperature 441 and a second Ru sublayer is deposited onto the first Ru sublayer while maintaining the substrate at the temperature 441. The CO partial pressure in the process chamber is decreased from a CO partial pressure 439 to a CO partial pressure 440 during the deposition of the first and second Ru sublayers.

Figure 4J:
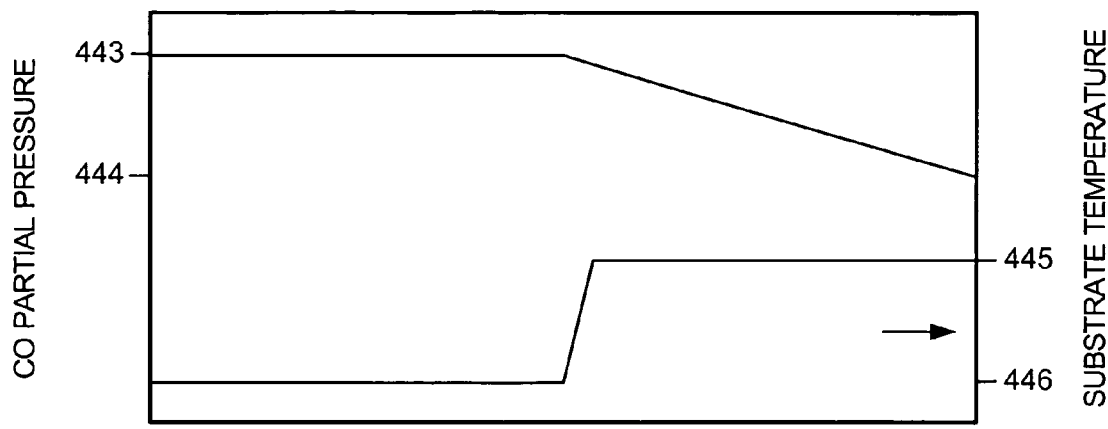

In FIG. 4J, a first Ru sublayer is deposited while maintaining a CO partial pressure 443 in the process chamber and maintaining the substrate at a temperature 446. Next, the substrate temperature is increased from the temperature 446 to a temperature 445 and a second Ru sublayer is deposited onto the first Ru sublayer while maintaining the substrate at the temperature 445 and decreasing the CO partial pressure from the CO partial pressure 443 to a CO partial pressure 444.

Figure 4K:
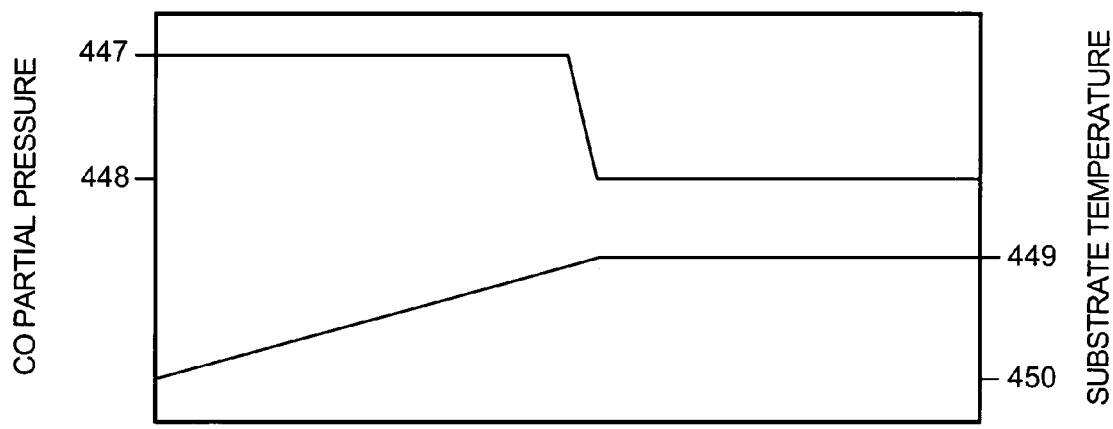

In FIG. 4K, a first Ru sublayer is deposited while maintaining a CO partial pressure 447 in the process chamber and increasing the temperature of the substrate from a temperature 450 to a temperature 449. Next, the CO partial pressure is reduced from the CO partial pressure 447 to a CO partial pressure 448 and a second Ru sublayer is deposited onto the first Ru sublayer while maintaining the CO partial pressure 448 and maintaining the substrate at the temperature 449.

Figure 4L:
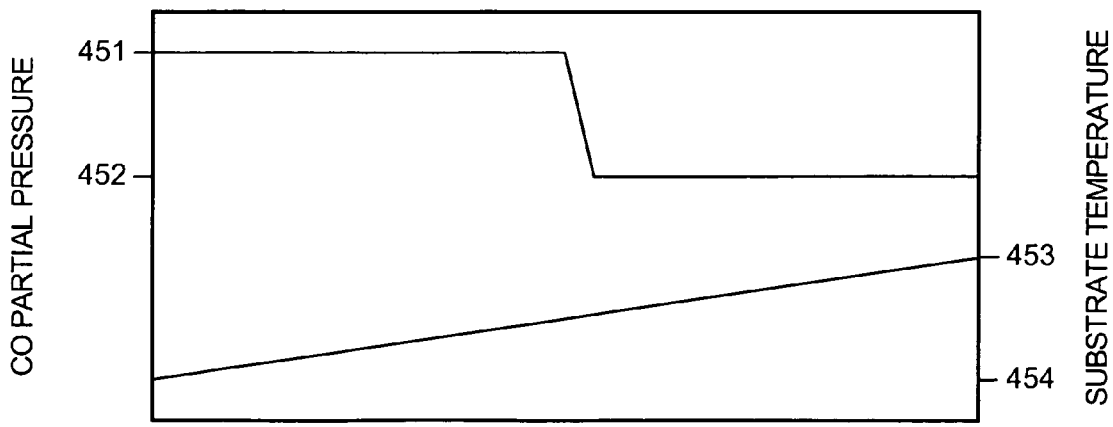

In FIG. 4L, a first Ru sublayer is deposited while maintaining a CO partial pressure 451 in the process chamber. Next, the CO partial pressure is reduced from the CO partial pressure 451 to a CO partial pressure 452 and a second Ru sublayer is deposited onto the first Ru sublayer while maintaining the CO partial pressure 452. The substrate temperature is increased from a temperature 454 to a temperature 453 during the deposition of the first and second Ru sublayers.

Figure 5C:
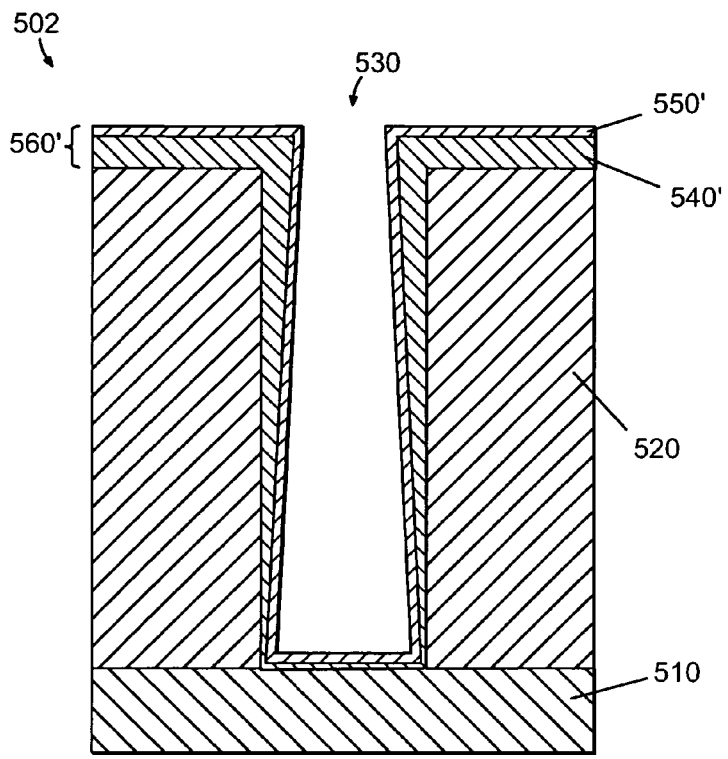

As those skilled in the art will readily appreciate, and with reference to structure 502 of FIG. 5C, a Ru layer 560' containing first and second Ru sublayers 540', 550', respectively, where the step coverage of the second Ru sublayer 550' is greater than the step coverage of the first Ru sublayer 540' can be formed by reversing in time the pressure and temperature steps depicted in FIGS. 4A-4L. For example, in FIG. 4A, a first Ru sublayer is deposited while maintaining a CO partial pressure 402 in the process chamber and a second Ru sublayer is deposited while maintaining a CO partial pressure 401.

Figure 4M:
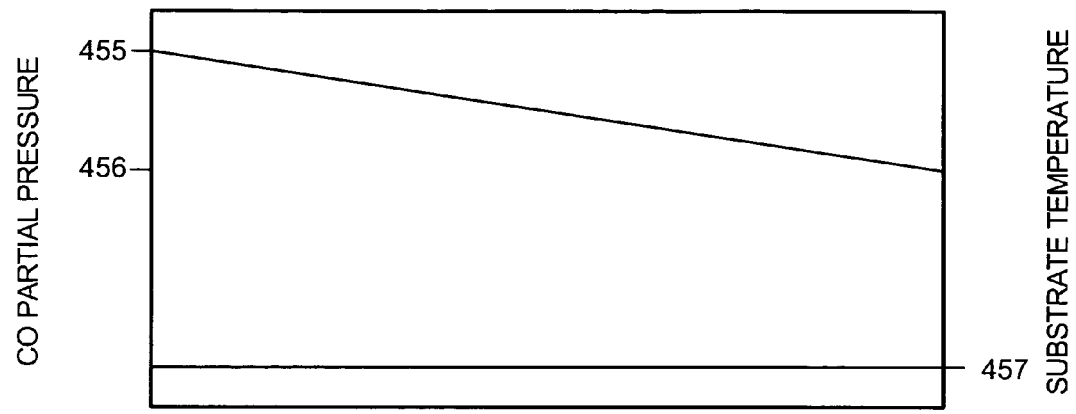
Figure 4N:
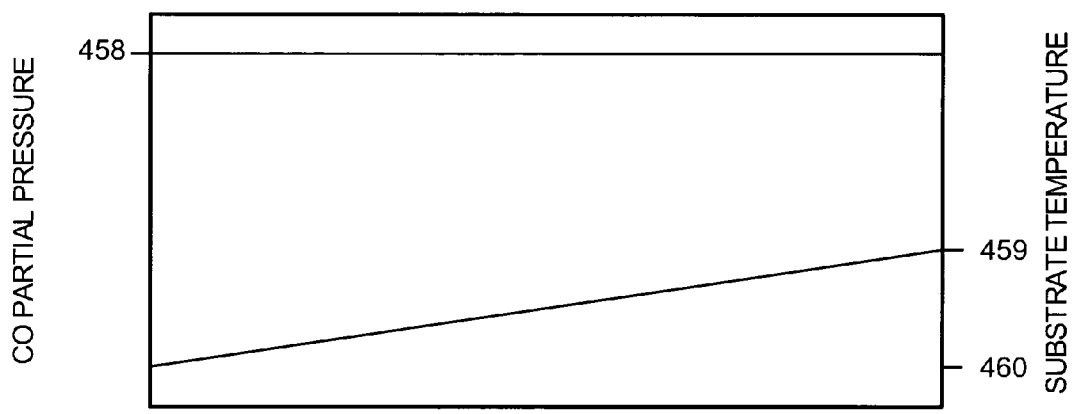
Figure 4O:
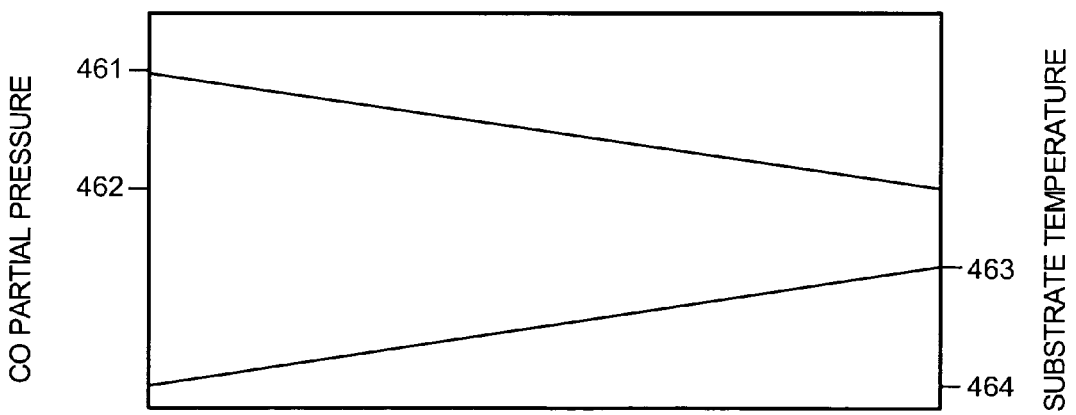
Figure 5D:
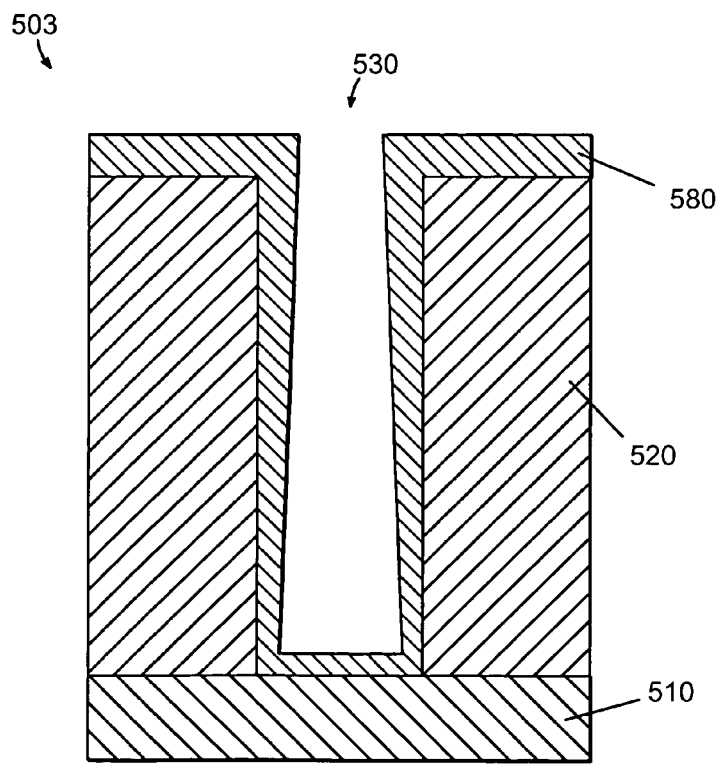

FIGS. 4M-4O schematically show CO partial pressure in a process chamber and temperature of the substrate during formation of a Ru layer according to embodiments of the invention, and FIG. 5D schematically depicts the resulting structure 503. In FIG. 4M, a Ru layer (e.g., Ru layer 580 shown in FIG. 5D) is deposited while reducing the CO partial pressure from a CO partial pressure 455 to a CO partial pressure 456 and maintaining the substrate at a temperature 457. In FIG. 4N, a Ru layer is deposited while maintaining a CO partial pressure 458 in the process chamber and increasing the temperature of the substrate from a temperature 460 to a temperature 459. In FIG. 4O, a Ru layer is deposited while reducing the CO partial pressure from a CO partial pressure 461 to a CO partial pressure 462 and increasing the temperature of the substrate from a temperature 464 to a temperature 463. In the embodiments shown in FIGS. 4M-4O, the step coverage of the Ru layer decreases during the deposition. Alternatively, if the pressure and temperature steps in FIGS. 4M-4O are reversed in time, the step coverage Ru layer will increase during the deposition.

In summary, FIGS. 4A-4O show examples of how the CO partial pressure in the process chamber and/or the temperature of the substrate may be varied during formation of a Ru layer on substrate. As those skilled in the art will readily appreciate, embodiments of the invention are not limited to the examples depicted in FIGS. 4A-4O, as other CO partial pressure and substrate temperature profiles may be used without deviating from the scope of the invention. For example, the single CO partial pressure decrease shown in FIG. 4A may be replaced by a plurality of smaller CO partial pressure decreases and the single temperature increase shown in FIG. 4B may be replaced by a plurality of smaller temperature increases. The Ru layer may be a single layer, as shown in FIG. 5D, or may contain any number of sublayers of varying step coverage. Thus, the Ru layer is not limited to two sublayers as depicted in FIGS. 5B and 5C.

Figure 5E:
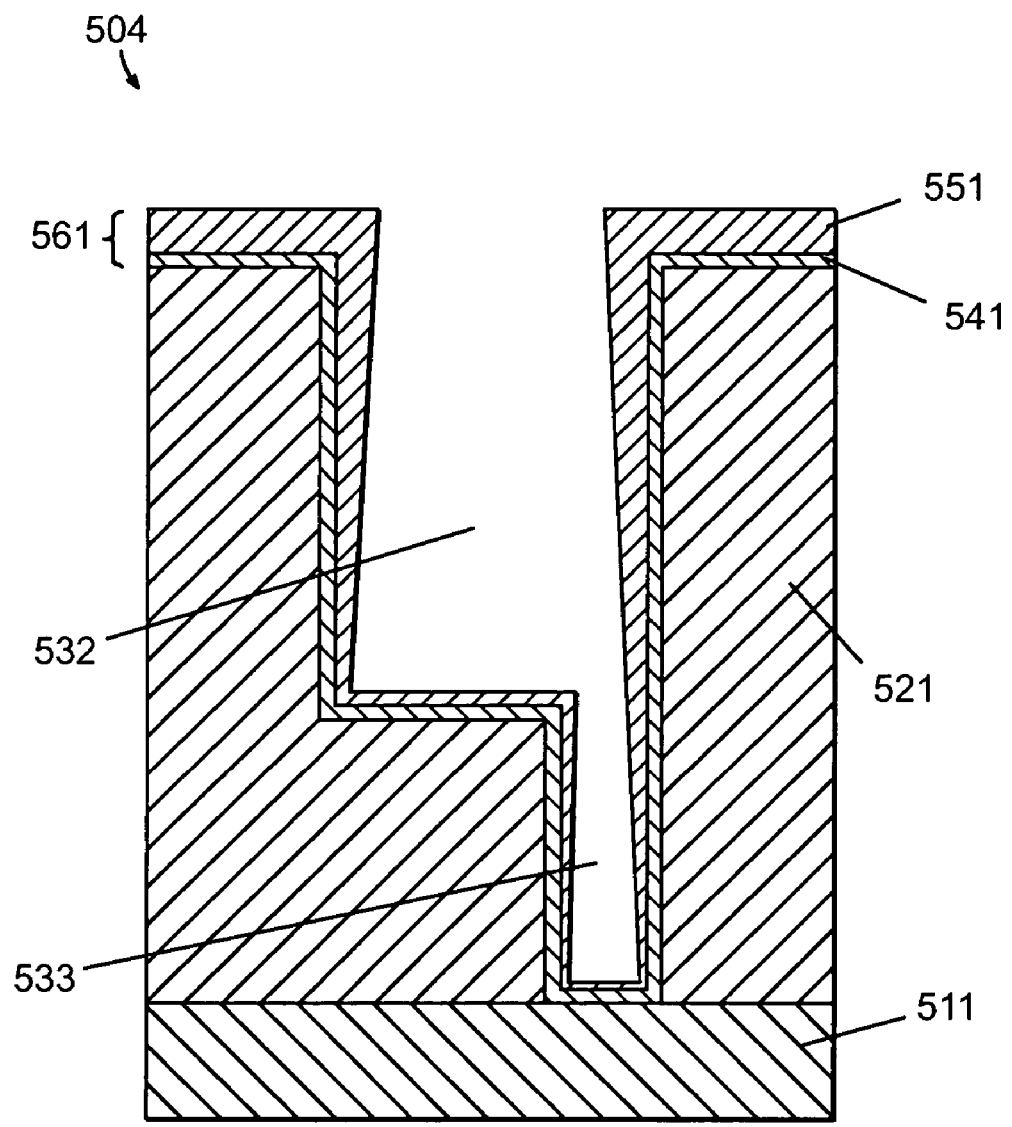

As those skilled in the art will readily appreciate, embodiments of the invention can be applied to patterned substrates containing features that include one or more vias or trenches, or combinations thereof. FIG. 5E schematically shows formation of a Ru layer 561 on a patterned structure 504 containing a trench 532 and a via 533 according to an embodiment of the invention. The patterned structure 504 further contains a first metal layer 511 and a patterned layer 521. The Ru layer 561 formed according to one embodiment of the present invention contains a first Ru sublayer 541 and a second Ru sublayer 551.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of forming a metal layer for an integrated circuit, comprising:
   providing a patterned substrate in a process chamber; and
   exposing the substrate to a process gas comprising a ruthenium carbonyl precursor and a CO gas to form a Ru layer over a feature of the patterned substrate, wherein the CO partial pressure in the process chamber is varied during the exposing to control the step coverage of the Ru layer over the feature, the exposing comprising
   depositing a first Ru sublayer over the feature while maintaining a first CO partial pressure in the process chamber, the first Ru sublayer having a first step coverage; and
   depositing a second Ru sublayer over the feature while maintaining a second CO partial pressure different from the first CO partial pressure in the process chamber, the second Ru sublayer having a second step coverage different from the first step coverage.

2. The method according to claim 1, wherein the process gas further comprises an inert dilution gas and wherein the CO partial pressure in the process chamber is varied by varying the amount of the CO gas relative to the amount of the inert dilution gas.

3. The method according to claim 1, wherein the feature comprises one or more vias or trenches, or combinations thereof.

4. The method according to claim 1, wherein the substrate temperature is maintained at a substantially constant temperature during the exposing.

5. The method according to claim 1, wherein the substrate temperature is between about 100° C. and about 300° C. during the exposing.

6. The method according to claim 1, wherein the first CO partial pressure is greater than the second CO partial pressure and the first step coverage is greater than the second step coverage.

7. The method according to claim 1, wherein at least one of the first Ru sublayer and the second Ru sublayer are deposited in a kinetic-limited temperature regime.

8. The method according to claim 1, wherein the exposing further comprises:
   maintaining the substrate at a first temperature during deposition of the first Ru sublayer; and
   maintaining the substrate at a second temperature during deposition of the second Ru sublayer, wherein the second substrate temperature is different from the first substrate temperature.

9. The method according to claim 1, wherein the first temperature is between about 100° C. and about 220° C. and the second temperature is between about 180° C. and about 300° C.

10. A computer readable medium containing program instructions for execution on a processor, which when executed by the processor, cause a deposition system to perform the steps in the method recited in claim 1.

11. The method according to claim 1, wherein a thickness of at least one of the first Ru sublayer or the second Ru sublayer is between about 0.5 nm and about 50 nm.

12. The method according to claim 1, wherein one of the first Ru sublayer and the second Ru sublayer has a step coverage greater than 50% and the other one of the first Ru sublayer and the second Ru sublayer has a step coverage less than 50%.

13. The method according to claim 1, wherein one of the first Ru sublayer and the second Ru sublayer has a step coverage greater than about 80% and the other one of the first Ru sublayer and the second Ru sublayer has a step coverage less than about 10%.

14. The method according to claim 1, wherein the CO partial pressure is between about 1 mTorr and about 100 mTorr.

15. The method according to claim 1, wherein the total gas pressure in the process chamber pressure is between about 5 mTorr and about 500 mTorr.

16. The method according to claim 1, wherein the ruthenium carbonyl precursor comprises $Ru_3(CO)_{12}$.

17. The method according to claim 1, wherein a CO gas flow rate is between about 10 sccm and about 500 sccm.

18. A method of forming a metal layer for an integrated circuit, comprising:

providing a patterned substrate in a process chamber; and exposing the substrate to a process gas comprising a ruthenium carbonyl precursor and a CO gas to form a Ru layer over a feature of the patterned substrate, wherein the substrate temperature in the process chamber is varied during the exposing to control the step coverage of the Ru layer over the feature, the exposing comprising depositing a first Ru sublayer over the feature while maintaining a first substrate temperature, the first Ru sublayer having a first step coverage; and depositing a second Ru sublayer over the first Ru sublayer while maintaining a second substrate temperature, wherein the first substrate temperature is lower than the second substrate temperature and the first step coverage is greater than the second step coverage.

19. The method according to claim 18, wherein at least one of the first Ru sublayer or the second Ru sublayers is deposited in a substantially kinetic-limited temperature regime.

20. The method according to claim 18, wherein a thickness of at least one of the first Ru sublayer or the second Ru sublayer is between about 0.5 nm and about 50 nm.

21. The method according to claim 18, wherein one of the first Ru sublayer and the second Ru sublayer has a step coverage greater than 50% and the other one of the first Ru sublayer and the second Ru sublayer has a step coverage less than 50%.

22. The method according to claim 18, wherein one of the first Ru sublayer and the second Ru sublayer has a step coverage greater than about 80% and the other one of the first Ru sublayer and the second Ru sublayer has a step coverage less than about 10%.

23. The method according to claim 18, wherein the CO partial pressure is between about 1 mTorr and about 100 mTorr.

24. The method according to claim 18, wherein the total gas pressure in the process chamber pressure is between about 5 mTorr and about 500 mTorr.

25. The method according to claim 18, wherein the ruthenium carbonyl precursor comprises $Ru_3(CO)_{12}$.

26. The method according to claim 18, wherein a CO gas flow rate is between about 10 sccm and about 500 sccm.

27. The method according to claim 18, wherein and the CO partial pressure is maintained at a substantially constant pressure during the exposing.

28. The method according to claim 18, wherein the first temperature is between about 100° C. and about 220° C. and the second temperature is between about 180° C. and about 300° C.

29. A computer readable medium containing program instructions for execution on a processor, which when executed by the processor, cause a deposition system to perform the steps in the method recited in claim 18.

* * * * *

UNITED STATES PATENT AND TRADEMARK OFFICE
CERTIFICATE OF CORRECTION

PATENT NO. : 7,482,269 B2
APPLICATION NO. : 11/238487
DATED : January 27, 2009
INVENTOR(S) : Kenji Suzuki It is certified that error appears in the above-identified patent and that said Letters Patent is hereby corrected as shown below:

Col. 2, line 26, the following paragraph should be inserted:
--According to an embodiment of the invention, the Ru layer contains a plurality of Ru sublayers and the step coverage of each Ru sublayer is controlled by selecting a corresponding CO partial pressure in the process chamber.--.

Col. 12, line 14, "can selected" should read --can be selected--.

Signed and Sealed this

Third Day of November, 2009

David J. Kappos
*Director of the United States Patent and Trademark Office*